US012356671B2

(12) United States Patent
Kim et al.

(10) Patent No.: US 12,356,671 B2
(45) Date of Patent: Jul. 8, 2025

(54) SEMICONDUCTOR DEVICE

(71) Applicant: Samsung Electronics Co., Ltd., Suwon-si (KR)

(72) Inventors: Cheol Kim, Hwaseong-si (KR); Jeong Yeon Seo, Seoul (KR); Dong Kwon Kim, Suwon-si (KR); Hyun Ho Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 678 days.

(21) Appl. No.: 17/648,155

(22) Filed: Jan. 17, 2022

(65) Prior Publication Data
US 2022/0376046 A1    Nov. 24, 2022

(30) Foreign Application Priority Data
May 18, 2021  (KR) .................. 10-2021-0064125

(51) Int. Cl.
*H10D 30/67*  (2025.01)
*H10D 30/01*  (2025.01)
(Continued)

(52) U.S. Cl.
CPC ....... *H10D 30/6757* (2025.01); *H10D 30/014* (2025.01); *H10D 30/43* (2025.01);
(Continued)

(58) Field of Classification Search
CPC ......... H01L 29/78696; H01L 29/66439; H01L 29/66545; H01L 29/775; H01L 29/0649;
(Continued)

(56) References Cited

U.S. PATENT DOCUMENTS 5,508,223 A    4/1996  Tseng
10,566,248 B1  2/2020  Chanemougame et al.
(Continued)

FOREIGN PATENT DOCUMENTS

KR   10-2016-0140321 A   12/2016
KR   10-2020-0009848 A   1/2020
KR   10-2021-0024405 A   3/2021

OTHER PUBLICATIONS

Office Action dated Mar. 28, 2025 issued in corresponding Korean Patent Application No. 10-2021-0064125.

*Primary Examiner* — Amar Movva
*Assistant Examiner* — Eric Manuel Mulero Flores
(74) *Attorney, Agent, or Firm* — MORGAN, LEWIS & BOCKIUS LLP

(57) ABSTRACT

A semiconductor device is provided. The semiconductor device includes a substrate, a first active pattern, which extends in a first direction on the substrate, a second active pattern, which extends in the first direction on the substrate and is spaced apart from the first active pattern by a first pitch in a second direction different from the first horizontal direction, a third active pattern, which extends in the first direction on the substrate and is spaced apart from the second active pattern by a second pitch greater than the first pitch in the second direction, a field insulating layer, which borders side walls of each of the first to third active patterns, a dam, which is between the first active pattern and the second active pattern on the field insulating layer, the region between the second active pattern and the third active pattern being free of the dam, a gate electrode, which extends in the second direction, and has a first portion on the first active pattern, a second portion on the second active pattern, and a third portion on the third active pattern, a first work function layer between the first portion of the gate (Continued)

electrode and the dam, and a second work function layer between the second portion of the gate electrode and the dam.

20 Claims, 24 Drawing Sheets

(51) Int. Cl.
  *H10D 30/43*  (2025.01)
  *H10D 30/62*  (2025.01)
  *H10D 62/10*  (2025.01)
  *H10D 64/01*  (2025.01)
(52) U.S. Cl.
  CPC ....... *H10D 30/6215* (2025.01); *H10D 62/121* (2025.01); *H10D 64/017* (2025.01)
(58) Field of Classification Search
  CPC ......... H01L 29/42368; H01L 29/42392; H01L 29/1079; H01L 21/823431; H01L 21/823462; H01L 21/823481; H01L 21/823456; H01L 21/823412; H01L 21/82345; H01L 27/088; H01L 29/66795–66818; H01L 29/7855–7859; H01L 29/0665–0673; H01L 2029/7857–7858; H01L 21/823821; H01L 21/845; H01L 21/28061; H01L 21/28079–28088; B82Y 10/00; H10D 64/665–666; H10D 30/0215; H10D 30/47; H10D 30/481–485; H10D 30/0245; H10D 62/121
  See application file for complete search history.

(56) References Cited

U.S. PATENT DOCUMENTS

| | | | |
|---|---|---|---|
| 10,790,354 B2 | 9/2020 | Webb et al. | |
| 10,832,916 B1 | 11/2020 | Xie et al. | |
| 2018/0315667 A1* | 11/2018 | Kwon | H01L 29/401 |
| 2019/0067417 A1 | 2/2019 | Ching et al. | |
| 2020/0027992 A1* | 1/2020 | Jung | H10D 30/6757 |
| 2020/0066725 A1 | 2/2020 | Bhuwalka et al. | |
| 2020/0219970 A1 | 7/2020 | Mannebach et al. | |
| 2020/0266192 A1 | 8/2020 | Ju et al. | |
| 2021/0028068 A1 | 1/2021 | Dentoni Litta et al. | |
| 2021/0057525 A1 | 2/2021 | Chiang et al. | |
| 2021/0151560 A1* | 5/2021 | Ching | H10D 62/116 |
| 2021/0233911 A1* | 7/2021 | Feng | H01L 21/31111 |
| 2021/0398861 A1* | 12/2021 | Lee | H01L 21/823842 |
| 2023/0275142 A1 | 8/2023 | Lhang et al. | |

* cited by examiner

SEMICONDUCTOR DEVICE

This application claims priority from Korean Patent Applications No. 10-2021-0064125 filed on May 18, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device. Specifically, the present disclosure relates to a semiconductor device including an MBCFET™ (Multi-Bridge Channel Field Effect Transistor).

2. Description of the Related Art

With the rapid supply of information media in recent years, of the functionality of semiconductor devices has also developed rapidly. Two design goals may be factors in the development of new semiconductor products: a low cost may be required for ensuring competitiveness, and a high integration of products may be required for high quality. For the purpose of high integration, semiconductor devices are being scaled down.

As a pitch size decreases, research for ensuring a reduction in capacitance and electrical stability between contacts in semiconductor devices may be required.

SUMMARY

Aspects of the present disclosure provide a semiconductor device in which a dam is formed on a field insulating layer between active patterns in a region in which a pitch between active patterns is relatively small, thereby reducing difficulty of etching of a region in which the dam is formed in the process of forming a gate electrode.

According to an example embodiment of the inventive concept, there is provided a semiconductor device, comprising a substrate, a first active pattern, which extends in a first direction on the substrate, a second active pattern, which extends in the first direction on the substrate and is spaced apart from the first active pattern by a first pitch in a second direction different from the first direction, a third active pattern, which extends in the first direction on the substrate and is spaced apart from the second active pattern by a second pitch greater than the first pitch in the second direction, a field insulating layer, which surrounds side walls of each of the first to third active patterns, a dam, which is between the first active pattern and the second active pattern on the field insulating layer, the region between the second active pattern and the third active pattern being free of the dam, a gate electrode, which extends in the second direction, and has a first portion on the first active pattern, a second portion on the second active pattern, and a third portion on the third active pattern, a first work function layer between the first portion of the gate electrode and the dam, and a second work function layer between the second portion of the gate electrode and the dam.

According to an example embodiment of the present disclosure, there is provided a semiconductor device, comprising a substrate, a first active pattern, which extends in a first direction on the substrate, a second active pattern, which extends in the first direction on the substrate and is spaced apart from the first active pattern by a first pitch in a second direction different from the first direction, a third active pattern, which extends in the first direction on the substrate and is spaced apart from the second active pattern by a second pitch greater than the first pitch in the second direction, a first plurality of nanosheets spaced apart from each other in a third direction on the first active pattern, the third direction being perpendicular to a plane defined by the first direction and the second direction, a second plurality of nanosheets spaced apart from each other in the third direction on the second active pattern, a third plurality of nanosheets spaced apart from each other in the third direction on the third active pattern, a field insulating layer, which borders side walls of each of the first to third active patterns, a dam, which is on the field insulating layer, between the first plurality of nanosheets and the second plurality of nanosheets, and a region between the second plurality of nanosheets and the third plurality of nanosheets is free of the dam, and a gate electrode, which extends in the second direction, and includes a first portion, which borders the first plurality of nanosheets, a second portion, which borders the second plurality of nanosheets, and a third portion, which borders the third plurality of nanosheets, wherein an upper surface of the dam is on a same plane as an upper surface of an uppermost nanosheet among the first plurality of nanosheets, or the upper surface of the dam is formed to be lower than the upper surface of the uppermost nanosheet, where the substrate provides a base reference plane.

According to an exemplary embodiment of the present disclosure, there is provided a semiconductor device, comprising a substrate, a first active pattern, which extends in a first direction on the substrate, a second active pattern, which extends in the first direction on the substrate and is spaced apart from the first active pattern by a first pitch in a second direction different from the first direction, a third active pattern, which extends in the first direction on the substrate and is spaced apart from the second active pattern by a second pitch greater than the first pitch in the second direction, a first plurality of nanosheets stacked to be spaced apart from each other in a third direction on the first active pattern, a second plurality of nanosheets stacked to be spaced apart from each other in the third direction on the second active pattern, a third plurality of nanosheets stacked to be spaced apart from each other in the third direction on the third active pattern, a field insulating layer, which borders side walls of each of the first to third active patterns, a dam, which is on the field insulating layer, between the first plurality of nanosheets and the second plurality of nanosheets, and is in physical contact with each of the first and second plurality of nanosheets, a region between the second plurality of nanosheets and the third plurality of nanosheets being free of the dam, a gate electrode, which extends in the second direction, and includes a first portion, which borders the first plurality of nanosheets, a second portion, which borders the second plurality of nanosheets, and a third portion, which borders the third plurality of nanosheets, a first work function layer, which is between the first portion of the gate electrode and the dam, and has a first thickness, a second work function layer, which is between the second portion of the gate electrode and the dam, and has a second thickness greater than the first thickness, and a gate insulating layer, which is between the dam and the first work function layer, and between the dam and the second work function layer, wherein a part of the second work function layer extends along an interface between the first portion of the gate electrode and the second portion of the gate electrode, and another part of the second work function layer extends along an interface between the second portion of the gate electrode and the third portion of the gate electrode, and an upper surface of the dam is on a same plane as an upper surface of an uppermost nanosheet among the first plurality of nanosheets.

However, aspects of the present disclosure are not restricted to the ones set forth above. These and other aspects of the present disclosure will become more apparent to one of ordinary skill in the art to which the present disclosure pertains by referencing the detailed description of the present disclosure given below.

BRIEF DESCRIPTION OF THE DRAWINGS

These and other aspects and features of the present disclosure will become more apparent by describing in detail example embodiments thereof referring to the attached drawings, in which.

DETAILED DESCRIPTION OF THE EMBODIMENTS

Although drawings of a semiconductor device according to some embodiments explain inclusion of a MBCFET™ (Multi-Bridge Channel Field Effect Transistor) including nanosheets, and a fin-type transistor (FinFET) including a channel region of a fin-type pattern shape as an example, the embodiment is not limited thereto. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Hereinafter, a semiconductor device according to some embodiments of the inventive concept will be described referring to FIGS. 1 to 4.

Figure 1:
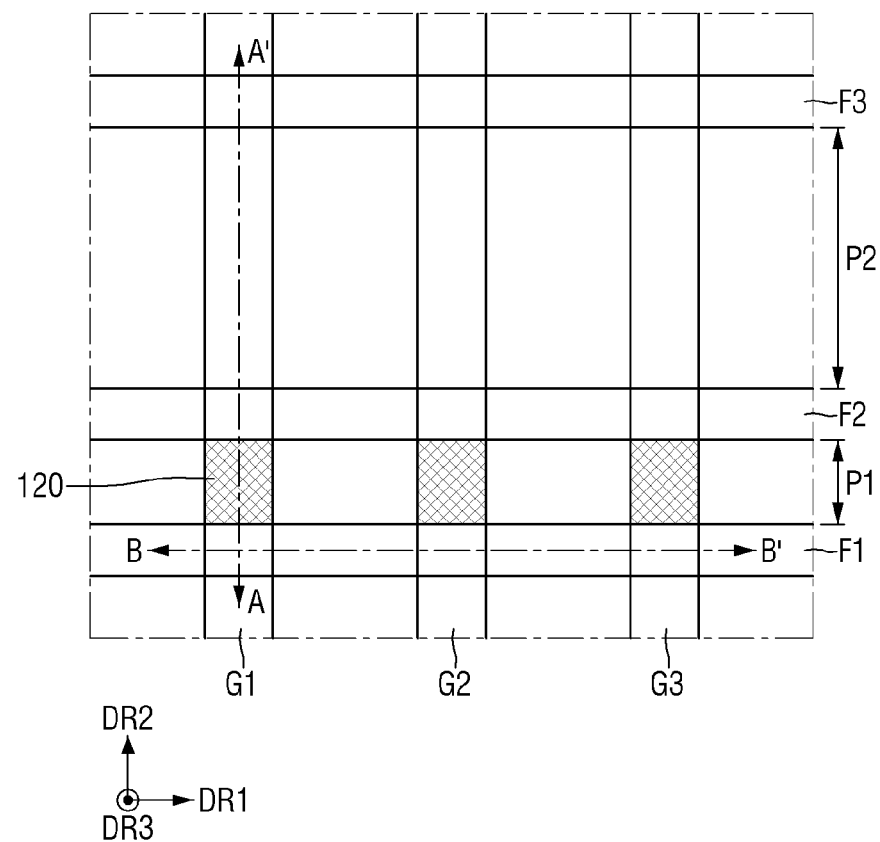
FIG. 1 is a schematic layout diagram that illustrates a semiconductor device according to some embodiments of the inventive concept.
Figure 2:
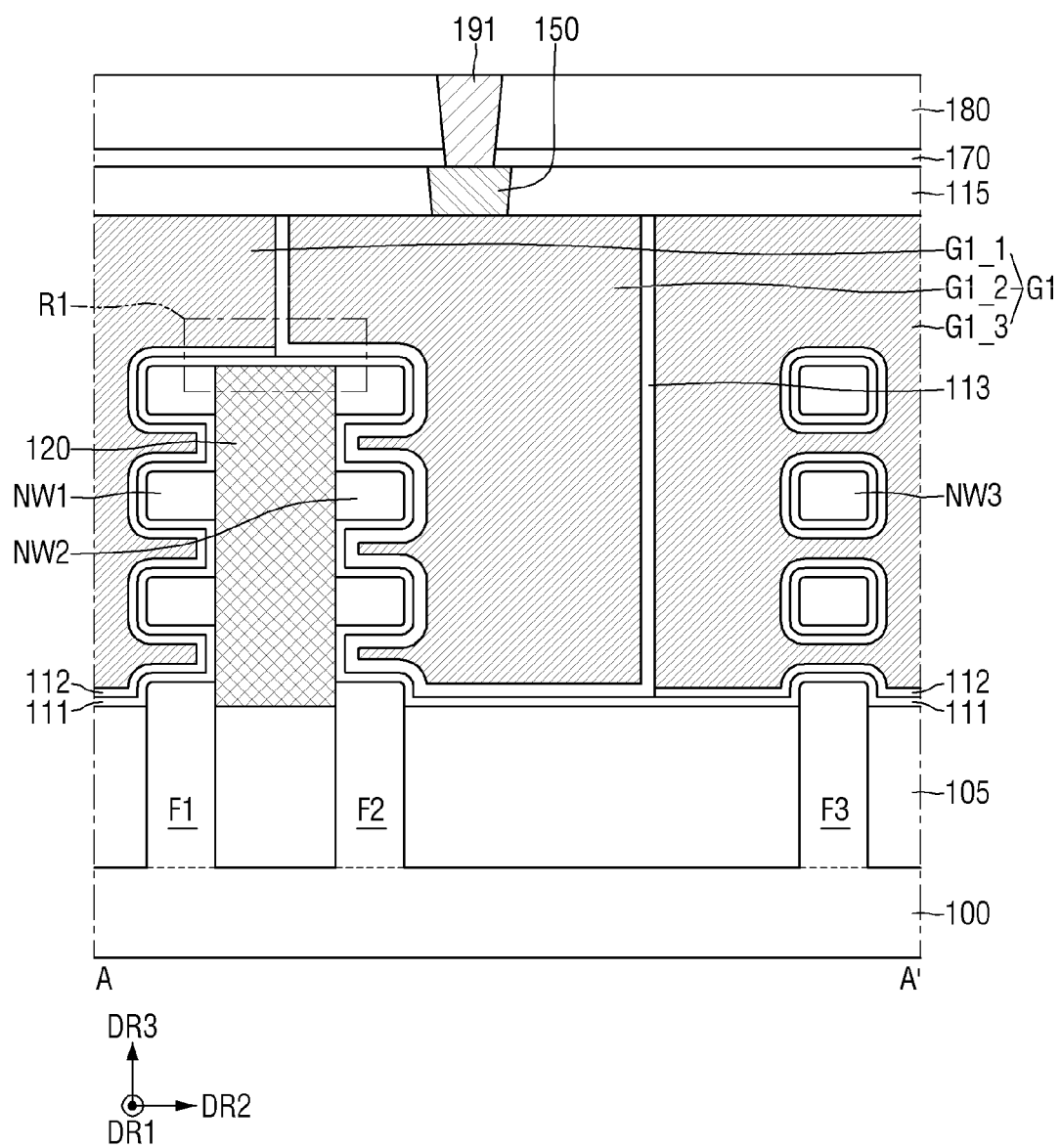
FIG. 2 is a cross-sectional view taken along a line A-A' of FIG. 1.
Figure 3:
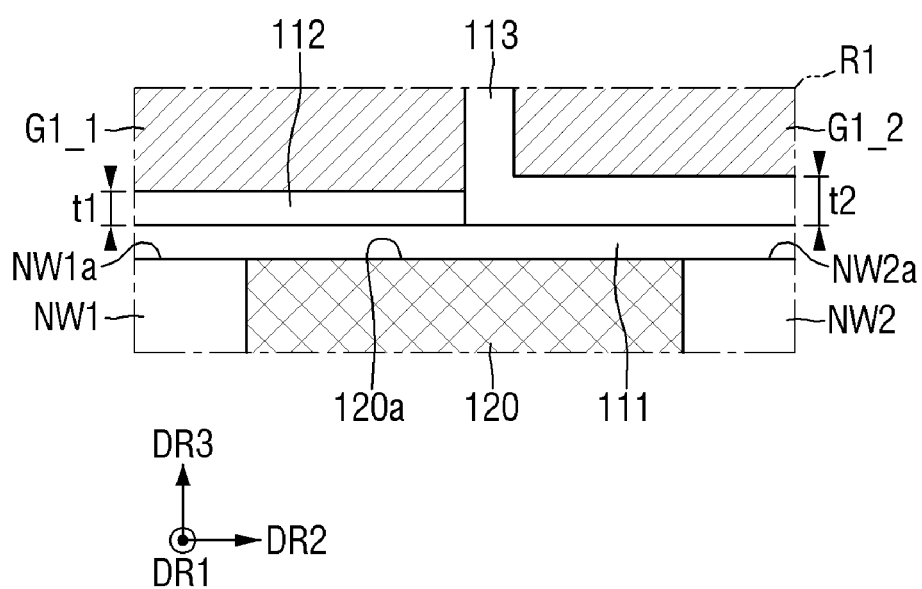
FIG. 3 is an enlarged view of a region R1 of FIG. 2.
Figure 4:
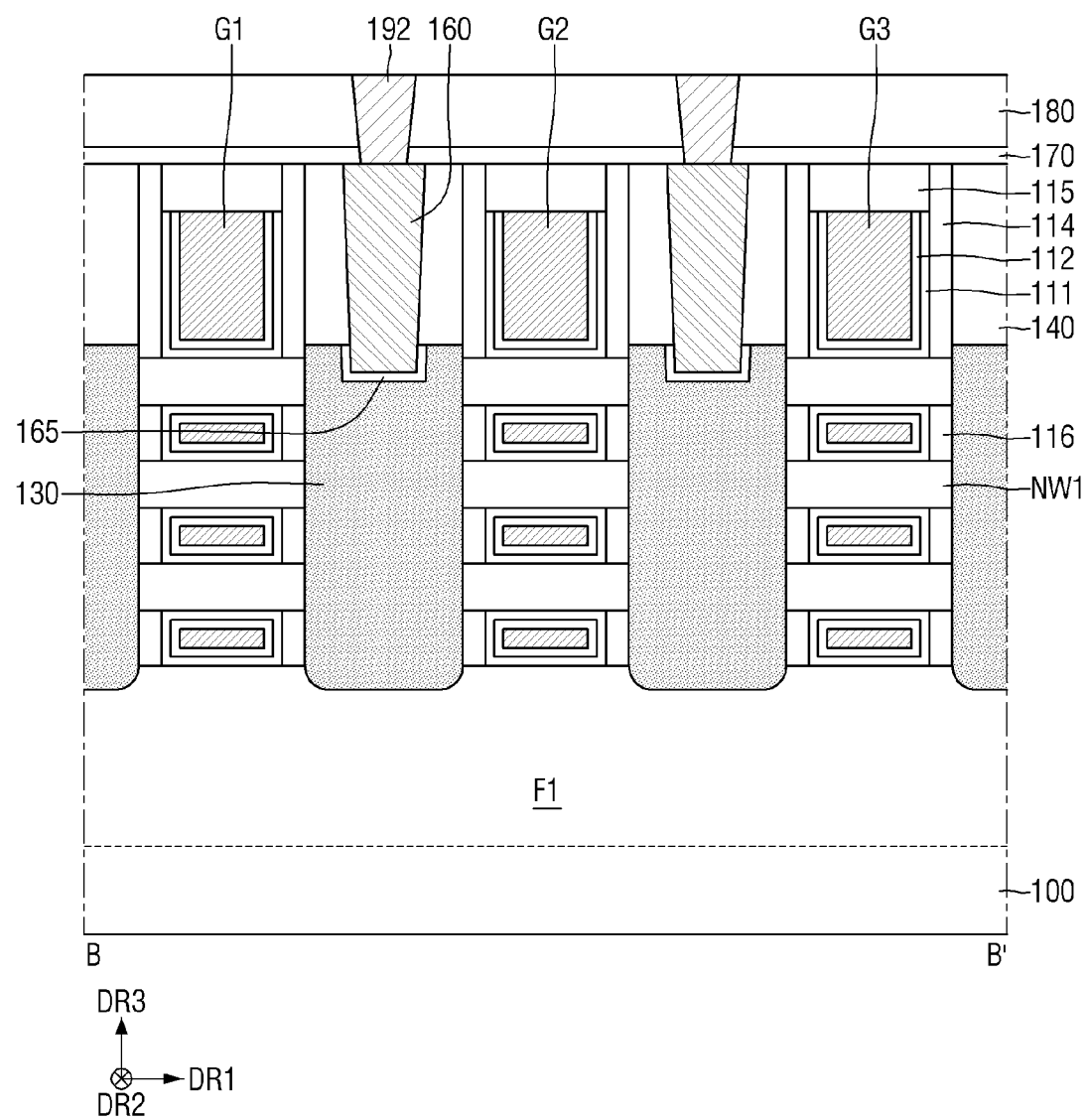
FIG. 4 is a cross-sectional view taken along a line B-B' of FIG. 1.

FIG. 1 is a schematic layout diagram that illustrates a semiconductor device according to some embodiments of the inventive concept. FIG. 2 is a cross-sectional view taken along a line A-A' of FIG. 1. FIG. 3 is an enlarged view of a region R1 of FIG. 2. FIG. 4 is a cross-sectional view taken along a line B-B' of FIG. 1.

Referring to FIGS. 1 to 4, the semiconductor device, according to some embodiments of the inventive concept, includes a substrate 100, first to third active patterns F1, F2 and F3, a field insulating layer 105, first to third plurality of nanosheets NW1, NW2 and NW3, first to third gate electrodes G1, G2 and G3, a gate insulating layer 111, a first work function layer 112, a second work function layer 113, a gate spacer 114, a capping pattern 115, an internal spacer 116, a dam 120, a source/drain region 130, a first interlayer insulating layer 140, a gate contact 150, a source/drain contact 160, a silicide layer 165, an etching stop layer 170, a second interlayer insulating layer 180, a first via 191, and a second via 192.

The substrate 100 may be a silicon substrate or an SOI (silicon-on-insulator). In other embodiments, the substrate 100 may include silicon germanium, SGOI (silicon germanium on insulator), indium antimonide, lead tellurium compounds, indium arsenic, indium phosphide, gallium arsenide or gallium antimonide, but embodiments of the inventive concept are not limited thereto.

Each of the first to third active patterns F1, F2 and F3 may protrude from the substrate 100 in a vertical direction DR3. A first active pattern F1 may extend in a first horizontal direction DR1. A second active pattern F2 may be spaced apart from the first active pattern F1 in a second horizontal direction DR2 that is different from the first horizontal direction DR1. The second active pattern F2 may extend in the first horizontal direction DR1. A third active pattern F3 may be spaced apart from the second active pattern F2 in the second horizontal direction DR2. The third active pattern F3 may extend in the first horizontal direction DR1.

For example, a second pitch P2 in the second horizontal DR2 between the second active pattern F2 and the third active pattern F3 may be greater than a first pitch P1 in the first horizontal DR2 between the first active pattern F1 and the second active pattern F2.

Each of the first to third active patterns F1, F2 and F3 may be a part of the substrate 100, and may include an epitaxial layer that is grown from the substrate 100. Each of the first to third active patterns F1, F2 and F3 may include, for example, silicon or germanium, which are elemental semiconductor materials. Further, each of the first to third active patterns F1, F2 and F3 may include a compound semiconductor, and may include, for example, a group IV-IV compound semiconductor or a group III-V compound semiconductor.

The group IV-IV compound semiconductor may be, for example, a binary compound or a ternary compound including at least two or more materials, such as carbon (C), silicon (Si), germanium (Ge), and tin (Sn), or a compound obtained by doping these elements with a group IV element. The group III-V compound semiconductor may be, for example, a binary compound, a ternary compound or a quaternary compound formed by combining one or more materials, such as aluminum (Al), gallium (Ga) and/or indium (In) as a group III element with one or more materials, such as phosphorus (P), arsenic (As) and/or antimony (Sb) as a group V element.

A field insulating layer 105 may be formed on the substrate 100. The field insulating layer 105 may surround or border the side walls of each of the first to third active patterns F1, F2 and F3. Each of the first to third active patterns F1, F2 and F3 may protrude from the upper surface of the field insulating layer 105 in the vertical direction DR3. Here, the vertical direction DR3 means a direction perpendicular to each of the first horizontal direction DR1 and the second horizontal direction DR2 or perpendicular to a plane formed by the first horizontal direction DR1 and the second horizontal direction DR2. The field insulating layer 105 may include, for example, an oxide film, a nitride film, an oxynitride film or a combination film thereof.

A first plurality of nanosheets NW1 may be disposed on the first active pattern F1. The first plurality of nanosheets NW1 may include a plurality of nanosheets stacked to be spaced apart from each other in the vertical direction DR3. The first plurality of nanosheets NW1 may include a portion surrounded or bordered by the first gate electrode G1, a portion surrounded or bordered by the second gate electrode G2, and a portion surrounded or bordered by the third gate electrode G3. A portion of the first plurality of nanosheets NW1 surrounded or bordered by the first gate electrode G1, a portion of the first plurality of nanosheets NW1 surrounded or bordered by the second gate electrode G2, and a portion of the first plurality of nanosheets NW1 surrounded or bordered by the third gate electrode G3 may each be spaced apart from each other in the first horizontal direction DR1.

A second plurality of nanosheets NW2 may be disposed on the second active pattern F2. The second plurality of nanosheets NW2 may include a plurality of nanosheets stacked to be spaced apart from each other in the vertical direction DR3. The second plurality of nanosheets NW2 may include a portion surrounded or bordered by the first gate electrode G1, a portion surrounded or bordered by the second gate electrode G2, and a portion surrounded or bordered by the third gate electrode G3. A portion of the second plurality of nanosheets NW2 surrounded or bordered by the first gate electrode G1, a portion of the second plurality of nanosheets NW2 surrounded or bordered by the second gate electrode G2, and a portion of the second plurality of nanosheets NW2 surrounded or bordered by the third gate electrode G3 may each be spaced apart from each other in the first horizontal direction DR1.

The third plurality of nanosheets NW3 may be disposed on the third active pattern F3. The third plurality of nanosheets NW3 may include a plurality of nanosheets stacked to be spaced apart from each other in the vertical direction DR3. The third plurality of nanosheets NW3 may include a portion surrounded or bordered by the first gate electrode G1, a portion surrounded or bordered by the second gate electrode G2, and a portion surrounded or bordered by the third gate electrode G3. A portion of the third plurality of nanosheets NW3 surrounded or bordered by the first gate electrode G1, a portion of the third plurality of nanosheets NW3 surrounded or bordered by the second gate electrode G2, and a portion of the third plurality of nanosheets NW3 surrounded or bordered by the third gate electrode G3 may each be spaced apart from each other in the first horizontal direction DR1.

Although FIGS. 2 and 4 show that each of the first to third plurality of nanosheets NW1, NW2 and NW3 includes three nanosheets that are stacked to be spaced apart from each other in the vertical direction DR3, this is merely for convenience of description, and embodiments of the inventive concept are not limited thereto. In some other embodiments, the first to third plurality of nanosheets NW1, NW2 and NW3 may each include four or more nanosheets stacked to be spaced apart from each other in the vertical direction DR3.

The dam 120 may be disposed on the field insulating layer 105. The dam 120 may be disposed on the field insulating layer 105 in a narrow region between the active patterns. However, the dam 120 is not disposed on the field insulating layer 105 in a wide region between the active patterns. For example, the dam 120 may be disposed between the first active pattern F1 and the second active pattern F2 on the field insulating layer 105. However, the dam 120 is not disposed between the second active pattern F2 and the third active pattern F3.

The dam 120 may be disposed between the first plurality of nanosheets NW1 and the second plurality of nanosheets NW2. However, the dam 120 is not disposed between the second plurality of nanosheets NW2 and the third plurality of nanosheets NW3.

The dam 120 may be in physical contact with the upper surface of the field insulating layer 105. Further, the dam 120 may be in physical contact with each of the side walls of the first plurality of nanosheets NW1 and the side walls of the second plurality of nanosheets NW2. For example, the dam 120 may be in physical contact with the side walls of the first active pattern F1 that protrudes from the upper surface of the field insulating layer 105 in the vertical direction DR3. Further, the dam 120 may be in physical contact with the side wall of the second active pattern F2 that protrudes from the upper surface of the field insulating layer 105 in the vertical direction DR3. However, embodiments of the inventive concept are not limited thereto.

An upper surface 120a of the dam 120 may be formed on the same plane as an upper surface NW1a of the uppermost nanosheet among the first plurality of nanosheets NW1. Further, the upper surface 120a of the dam 120 may be formed on the same plane as an upper surface NW2a of the uppermost nanosheet among the second plurality of nanosheets NW2.

The dam 120 may be surrounded or bordered by each of the first to third gate electrodes G1, G2 and G3. For example, a portion of the dam 120 surrounded or bordered by the first gate electrode G1, a portion of the dam 120 surrounded or bordered by the second gate electrode G2, and a portion of the dam 120 surrounded or bordered by the third gate electrode G3 may each be spaced apart from each other in the first horizontal direction DR1.

The dam 120 may include, for example, one or more materials, such as silicon nitride (SiN), silicon oxynitride (SiON), silicon carbonitride (SiCN), silicon oxycarbonitride (SiOCN), silicon carbide (SiC), silicon oxycarbide (SiOC) or combinations thereof. In some other embodiments, the dam 120 may include one or more high dielectric constant materials having a higher dielectric constant than silicon oxide ($SiO_2$). The high dielectric constant material may include, for example, one or more materials, such as hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

Each of the first to third gate electrodes G1, G2 and G3 may extend in the second horizontal direction DR2 on the field insulating layer 105, the first active pattern F1, the second active pattern F2, and the third active pattern F3. Each of the first to third gate electrodes G1, G2 and G3 may intersect each of the first active pattern F1, the second active pattern F2 and the third active pattern F3.

Each of the first to third gate electrodes G1, G2 and G3 may be sequentially spaced apart from each other in the first horizontal direction DR1. Specifically, the second gate electrode G2 may be spaced apart from the first gate electrode G1 in the first horizontal direction DR1. The third gate electrode G3 may be spaced apart from the second gate electrode G2 in the first horizontal direction DR1. Each of the first to third gate electrodes G1, G2 and G3 may surround or border each of a plurality of first to third plurality of nanosheets NW1, NW2 and NW3.

For example, the first gate electrode G1 may include a first portion G1_1, a second portion G1_2, and a third portion G1_3. The first portion G1_1 of the first gate electrode G1 may be disposed on the first active pattern F1. The first portion G1_1 of the first gate electrode G1 may surround or border the first plurality of nanosheets NW1. At least a part of the first portion G1_1 of the first gate electrode G1 may be disposed on the upper surface 120a of the dam 120. However, embodiments of the inventive concept are not limited thereto.

The second portion G1_2 of the first gate electrode G1 may be disposed on the second active pattern F2. The second portion G1_2 of the first gate electrode G1 may surround or border a second plurality of nanosheets NW2. At least a part of the second portion G1_2 of the first gate electrode G1 may be disposed on the upper surface 120a of the dam 120. However, embodiments of the inventive concept are not limited thereto. The third portion G1_3 of the first gate electrode G1 may be disposed on the third active pattern F3. The third portion G1_3 of the first gate electrode G1 may surround or border the third plurality of nanosheets NW3.

Each of the first to third gate electrodes G1, G2 and G3 may include, for example, one or more materials, such as titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first to third gate electrodes G1, G2 and G3 may include a conductive metal oxide, a conductive metal oxynitride, and the like, and may also include an oxidized form of the above-mentioned materials.

The source/drain region 130 may be disposed on at least one side of each of the first to third gate electrodes G1, G2 and G3 on each of the first to third active patterns F1, F2 and F3. The source/drain region 130 may be in physical contact with each of the first to third plurality of nanosheets NW1, NW2 and NW3. For example, although FIG. 4 shows that the upper surface of the source/drain region 130 is formed to be higher than an upper surface NW1a of the uppermost nanosheet among the first plurality of nanosheets NW1, embodiments of the inventive concept are not limited thereto.

A gate spacer 114 may extend along the second horizontal direction DR2 along the side walls of each of the first to third gate electrodes G1, G2 and G3 on the uppermost nanosheet of each of the first to third plurality of nanosheets NW1, NW2 and NW3. Each of the first to third gate electrodes G1, G2 and G3 may be disposed inside a gate trench, which is defined by the gate spacer 114 on the uppermost nanosheet of each of the first to third plurality of nanosheets NW1, NW2 and NW3.

Further, the gate spacer 114 may extend in the second horizontal direction DR2 along the side walls of each of the first to third gate electrodes G1, G2 and G3 on the field insulating layer 105. Each of the first to third gate electrodes G1, G2 and G3 may be disposed inside the gate trench defined by the gate spacer 114 on the field insulating layer 105.

The gate spacer 114 may include, for example, one or more materials, such as silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC) and combinations thereof.

For example, the internal spacer 116 may be disposed on both sides of each of the first to third gate electrodes G1, G2 and G3 between the first plurality of nanosheets NW1. Further, the internal spacer 116 may be disposed on both sides of each of the first to third gate electrodes G1, G2 and G3, between the first active pattern F1 and the lowermost nanosheet of the first plurality of nanosheets NW1. The internal spacer 116 may be disposed between the source/drain region 130 and each of the first to third gate electrodes G1, G2 and G3. In some other embodiments, the internal spacer 116 may be omitted.

The internal spacer 116 may be in physical contact with the source/drain region 130. Although FIG. 4 shows that the side walls of the internal spacer 116 that are in physical contact with the source/drain region 130 are arranged with the side walls of each of the first to third plurality of nanosheets NW1, NW2 and NW3 in the vertical direction DR3, embodiments of the inventive concept are not limited thereto.

The internal spacer 116 may include, for example, one or more materials, such as silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC) and combinations thereof. However, embodiments of the inventive concept are not limited thereto.

The gate insulating layer 111 may be disposed between each of the first to third gate electrodes G1, G2 and G3 and each of the first to third plurality of nanosheets NW1, NW2 and NW3. The gate insulating layer 111 may be disposed between each of the first to third gate electrodes G1, G2 and G3 and the gate spacer 114. The gate insulating layer 111 may be disposed between each of the first to third gate electrodes G1, G2 and G3 and the internal spacer 116. The gate insulating layer 111 may be disposed between each of the first to third gate electrodes G1, G2 and G3 and each of the first to third active patterns F1, F2 and F3. The gate insulating layer 111 may be disposed between each of the first to third gate electrodes G1, G2 and G3 and the field insulating layer 105.

Further, the gate insulating layer 111 may be disposed between each of the first to third gate electrodes G1, G2 and G3 and the dam 120. The gate insulating layer 111 may be in physical contact with the upper surface 120a of the dam 120. The gate insulating layer 111 may be in physical contact with the side walls of the dam 120, between the first plurality of nanosheets NW1, between the second plurality of nanosheets NW2, and between the third plurality of nanosheets NW3. The gate insulating layer 111 may be in physical contact with the side walls of the dam 120, between the first active pattern F1 and the first plurality of nanosheets NW1, between the second active pattern F2 and the second plurality of nanosheets NW2, and between the third active pattern F3 and the third plurality of nanosheets NW3.

The gate insulating layer 111 may include one or more materials, such as silicon oxide, silicon oxynitride, silicon nitride or a high dielectric constant material having a higher dielectric constant than silicon oxide. The high dielectric constant materials may include, for example, materials, such as hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The semiconductor device according to some other embodiments may include an NC (Negative Capacitance) FET that uses a negative capacitor. For example, the gate insulating layer 111 may include a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each individual capacitor. On the other hand, if at least one of the capacitances of the two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. By the use of the increased overall capacitance value, a transistor including the ferroelectric material film may have a subthreshold swing (SS) of less than 60 mV/decade at room temperature.

The ferroelectric material film may have ferroelectric properties. The ferroelectric material film may include one or more materials, such as hafnium oxide, hafnium zirconium oxide, barium strontium titanium oxide, barium titanium oxide, and/or lead zirconium titanium oxide. As an example, the hafnium zirconium oxide may be a material obtained by doping hafnium oxide with zirconium (Zr). As another example, the hafnium zirconium oxide may be a compound of hafnium (Hf), zirconium (Zr) and/or oxygen (O).

The ferroelectric material film may further include a doped dopant. For example, the dopant may include one or more materials, such as aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). The type of dopant contained in the ferroelectric material film may differ, depending on which type of ferroelectric material is contained in the ferroelectric material film.

When the ferroelectric material film includes hafnium oxide, the dopant contained in the ferroelectric material film may include, for example, gadolinium (Gd), silicon (Si), zirconium (Zr), aluminum (Al), and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include one or more materials, such as, for example, a silicon oxide and/or a metal oxide having a high dielectric constant. The metal oxide contained in the paraelectric material film may include, for example, but is not limited to, one or more materials, such as hafnium oxide, zirconium oxide, and/or aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of the hafnium oxide contained in the ferroelectric material film is different from a crystal structure of the hafnium oxide contained in the paraelectric material film.

The ferroelectric material film may have a thickness having ferroelectric properties. The thickness of the ferroelectric material film may be, for example, but is not limited to, 0.5 to 10 nm. Because each ferroelectric material may have a different critical thickness that exhibits ferroelectric properties, the thickness of the ferroelectric material film may vary depending on the ferroelectric material.

As an example, the gate insulating layer 111 may include a single ferroelectric material film. As another example, the gate insulating layer 111 may include a plurality of ferroelectric material films spaced apart from each other. The gate insulating layer 111 may have a stacked film structure in which the plurality of ferroelectric material films and the plurality of paraelectric material films are alternately stacked.

For example, the first work function layer 112 may be disposed between the gate insulating layer 111 and the first portion G1_1 of the first gate electrode G1. The first work function layer 112 may be disposed between the gate insulating layer 111 and the third portion G1_3 of the first gate electrode G1. Further, the first work function layer 112 may be disposed between the first portion G1_1 of the first gate electrode G1 and the dam 120.

The first work function layer 112 may include, for example, one or more materials, such as lanthanum oxide, titanium oxide, aluminum oxide, zirconium oxide, and/or hafnium oxide. However, embodiments of the inventive concept are not limited thereto.

For example, the second work function layer 113 may be disposed between the gate insulating layer 111 and the second portion G1_2 of the first gate electrode G1. The second work function layer 113 may be disposed to extend along an interface between the first portion G1_1 of the first gate electrode G1 and the second portion G1_2 of the first gate electrode G1. The second work function layer 113 may be disposed to extend along an interface between the second portion G1_2 of the first gate electrode G1 and the third portion G1_3 of the first gate electrode G1. Further, the second work function layer 113 may be disposed between the first portion G1_1 of the first gate electrode G1 and the dam 120.

A top surface of the second work function layer 113 at the interface between the first portion G1_1 of the first gate electrode G1 and the second portion G1_2 of the first gate electrode G1 may be formed on the same plane as the upper surface of the first gate electrode G1. Also, a top surface of the second work function layer 113 at the interface between the second portion G1_2 of the first gate electrode G1 and the third portion G1_3 of the first gate electrode G1 may be formed on the same plane as the upper surface of the first gate electrode G1. For example, the second work function layer 113 may be in physical contact with the first work function layer 112 on the upper surface 120a of the dam 120.

The second work function layer 113 may include a material different from the first work function layer 112. The second work function layer 113 may include, for example, titanium oxide, but embodiments of the inventive concept are not limited thereto.

A first thickness t1 of the first work function layer 112 may be different from a second thickness t2 of the second work function layer 113. For example, the second thickness t2 of the second work function layer 113 may be greater than the first thickness t1 of the first work function layer 112.

The capping pattern 115 may be disposed on each of the first to third gate electrodes G1, G2 and G3. For example, the capping pattern 115 may be in physical contact with the top surface of the second work function layer 113 at the interface between the first portion G1_1 of the first gate electrode G1 and the second portion G1_2 of the first gate electrode G1. Further, the capping pattern 115 may be in physical contact with the top surface of the second work function layer 113 at the interface between the second portion G1_2 of the first gate electrode G1 and the third portion G1_3 of the first gate electrode G1.

The capping pattern 115 may include, for example, one or more materials, such as silicon nitride (SiN), silicon oxynitride (SiON), silicon oxide (SiO$_2$), silicon carbonitride (SiCN), silicon oxycarbonitride (SiOCN) and combinations thereof.

The first interlayer insulating layer 140 may be disposed to be on and at least partially cover the gate spacer 114, the field insulating layer 105 and the source/drain region 130. For example, the upper surface of the first interlayer insulating layer 140 may be formed on the same plane as the upper surface of the capping pattern 115. However, embodiments of the inventive concept are not limited thereto. In some other embodiments, the first interlayer insulating layer 140 may also be on and at least partially cover the upper surface of the capping pattern 115.

The first interlayer insulating layer 140 may include, for example, one or more materials, such as silicon oxide, silicon nitride, silicon oxynitride, and/or a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylD-iSiloxane (HMDS), TriMethylSilyl Borate (TMSB), DiAc-etoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, and/or combinations thereof. However, embodiments of the inventive concept are not limited thereto.

The gate contact 150 may penetrate the first interlayer insulating layer 140 and the capping pattern 115 in the vertical direction DR3, and be connected to at least one of the first to third gate electrodes G1, G2 and G3. Although FIG. 2 shows that the gate contact 150 is formed of a single, monolithic film, this is merely for convenience of description, and embodiments of the inventive concept are not limited thereto. That is, the gate contact 150 may be formed of multiple films. The gate contact 150 may include a conductive material.

The source/drain contact 160 may penetrate the first interlayer insulating layer 140 in the vertical direction DR3, and be connected to the source/drain region 130. The source/drain contact 160 may extend into the source/drain region 130. Although FIG. 4 shows that the source/drain contact 160 is formed of a single, monolithic film, this is merely for convenience of description, and embodiments of the inventive concept are not limited thereto. That is, the source/drain contact 160 may be formed of multiple films. The source/drain contact 160 may include a conductive material.

The silicide layer 165 may be disposed between the source/drain region 130 and the source/drain contact 160. The silicide layer 165 may include, for example, a metal silicide material.

The etching stop layer 170 may be disposed on the first interlayer insulating layer 140. The etching stop layer 170 may be on and at least partially cover a part of the upper surface of the gate contact 150. Although FIGS. 2 and 4 show that the etching stop layer 170 is formed of a single, monolithic film, embodiments of the inventive concept are not limited thereto. In some other embodiments, the etching stop layer 170 may be formed of multiple films. The etching stop layer 170 may include, for example, one or more materials, such as silicon oxide, silicon nitride, silicon oxynitride, and/or a low dielectric constant material.

The second interlayer insulating layer 180 may be disposed on the etching stop layer 170. The second interlayer insulating layer 180 may include, for example, one or more materials, such as silicon oxide, silicon nitride, silicon oxynitride, and/or a low dielectric constant material.

The first via 191 may penetrate the second interlayer insulating layer 180 and the etching stop layer 170 in the vertical direction DR3, and be connected to the gate contact 150. Although FIG. 2 shows that the first via 191 is formed of a single, monolithic film, this is merely for convenience of description, and embodiments of the inventive concept are not limited thereto. That is, the first via 191 may be formed of multiple films. The first via 191 may include a conductive material.

The second via 192 may penetrate the second interlayer insulating layer 180 and the etching stop layer 170 in the vertical direction DR3, and be connected to the source/drain contact 160. Although FIG. 4 shows that the second via 192 is formed of a single, monolithic film, this is merely for convenience of description, and embodiments of the inventive concept are not limited thereto. That is, the second via 192 may be formed of multiple films. The second via 192 may include a conductive material.

The semiconductor device according to some embodiments of the inventive concept may include a dam 120 formed between a plurality of nanosheets NW1 and NW2 spaced apart from each other in the horizontal direction DR2 in a region in which a pitch between the active patterns F1 and F2 is relatively small. Accordingly, because the semiconductor device, according to some embodiments of the inventive concept, can be formed without the need to etch the region in which the dam 120 is formed in the process of forming the gate electrode G1, the fabrication process may be simplified.

Hereinafter, a method for fabricating a semiconductor device according to some embodiments of the inventive concept will be described referring to FIGS. 2, 5 to 15.

FIGS. 5 to 15 are intermediate stage diagrams that illustrate a method for fabricating a semiconductor device according to some embodiments of the inventive concept.

Figure 5:
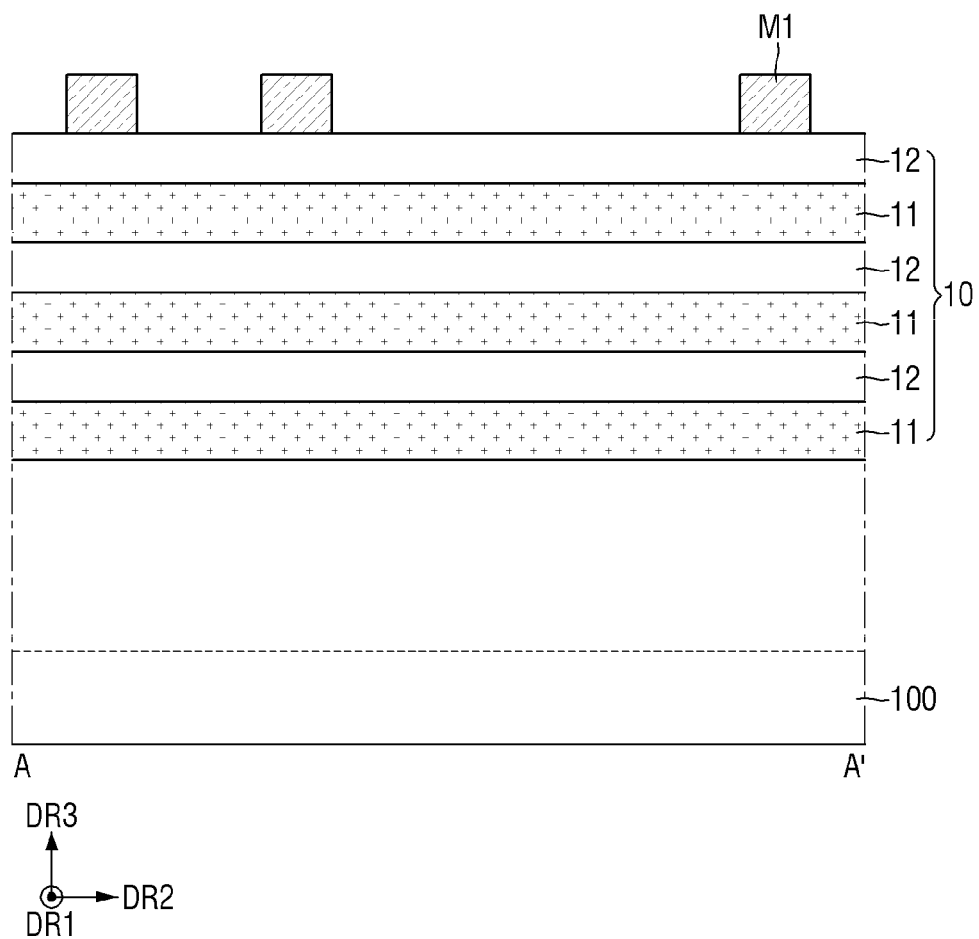
FIGS. 5 to 15 are intermediate stage diagrams that illustrate a method for fabricating a semiconductor device according to some embodiments of the inventive concept.

Referring to FIG. 5, a stacked structure 10 in which the first semiconductor layer 11 and the second semiconductor layer 12 are alternately stacked may be formed on the substrate 100. For example, the first semiconductor layer 11 may be formed at the bottom of the stacked structure 10, and the second semiconductor layer 12 may be formed at the top of the stacked structure 10. However, embodiments of the inventive concept are not limited thereto. The first semiconductor layer 11 may include, for example, silicon germanium (SiGe). The second semiconductor layer 12 may include, for example, silicon (Si). Subsequently, a first mask pattern M1 may be formed on the stacked structure 10.

Figure 6:
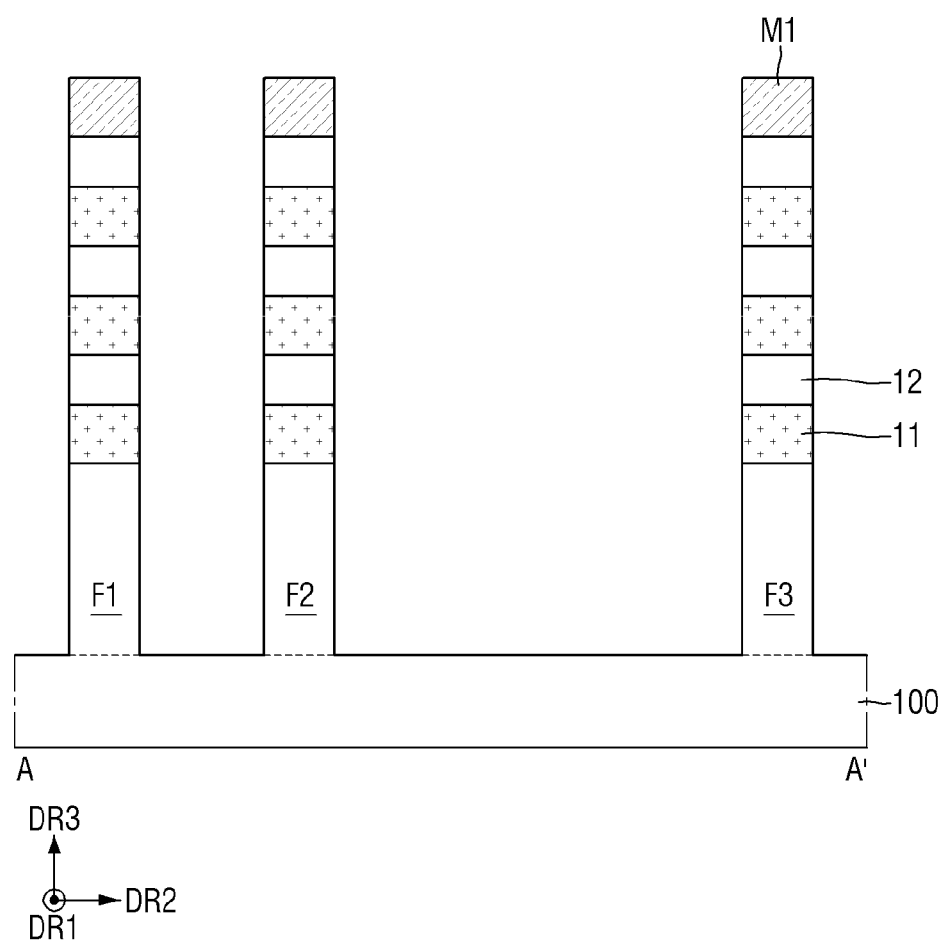

Referring to FIG. 6, the stacked structure 10 and the substrate 100 may be partially etched by using the first mask pattern M1 as a mask. Each of the first to third active patterns F1, F2 and F3 may be formed on the substrate 100 through the etching process. Each of the first to third active patterns F1, F2 and F3 may extend in the first horizontal direction DR1.

Figure 7:
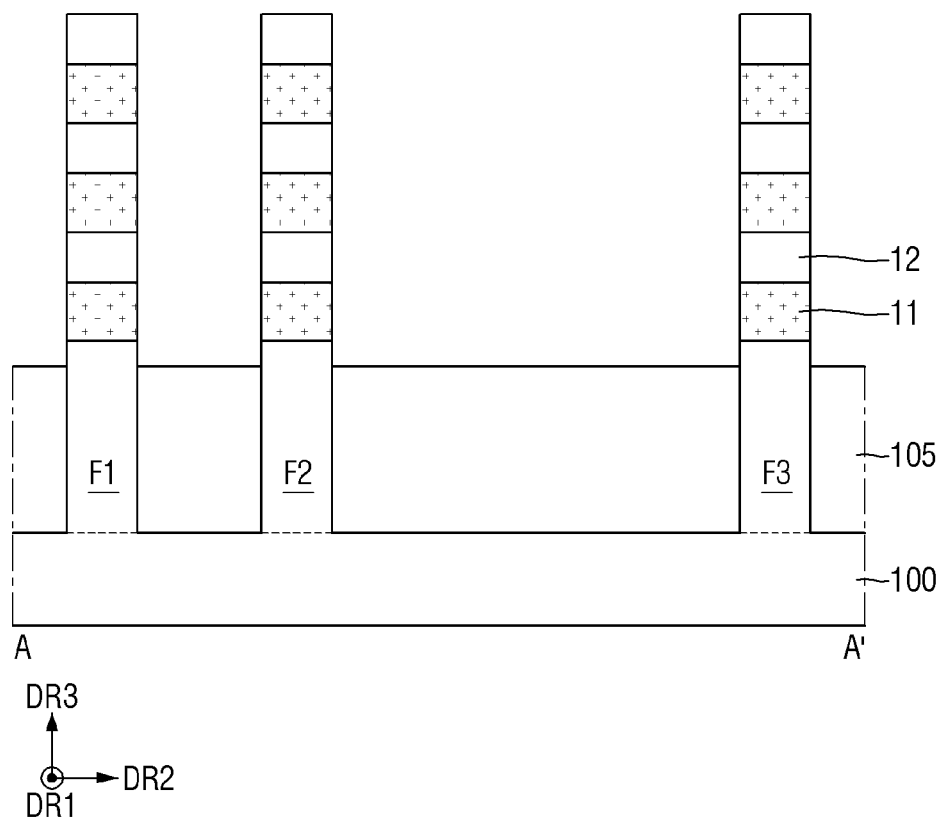

Referring to FIG. 7, the field insulating layer 105 may be formed on the substrate 100. The field insulating layer 105 may surround or border the side walls of each of the first to third active patterns F1, F2 and F3. The upper surface of the field insulating layer 105 may be formed to be lower than the upper surface of each of the first to third active patterns F1, F2 and F3 where the substrate 100 provides a base reference layer. Subsequently, the first mask pattern M1 may be removed.

Figure 8:
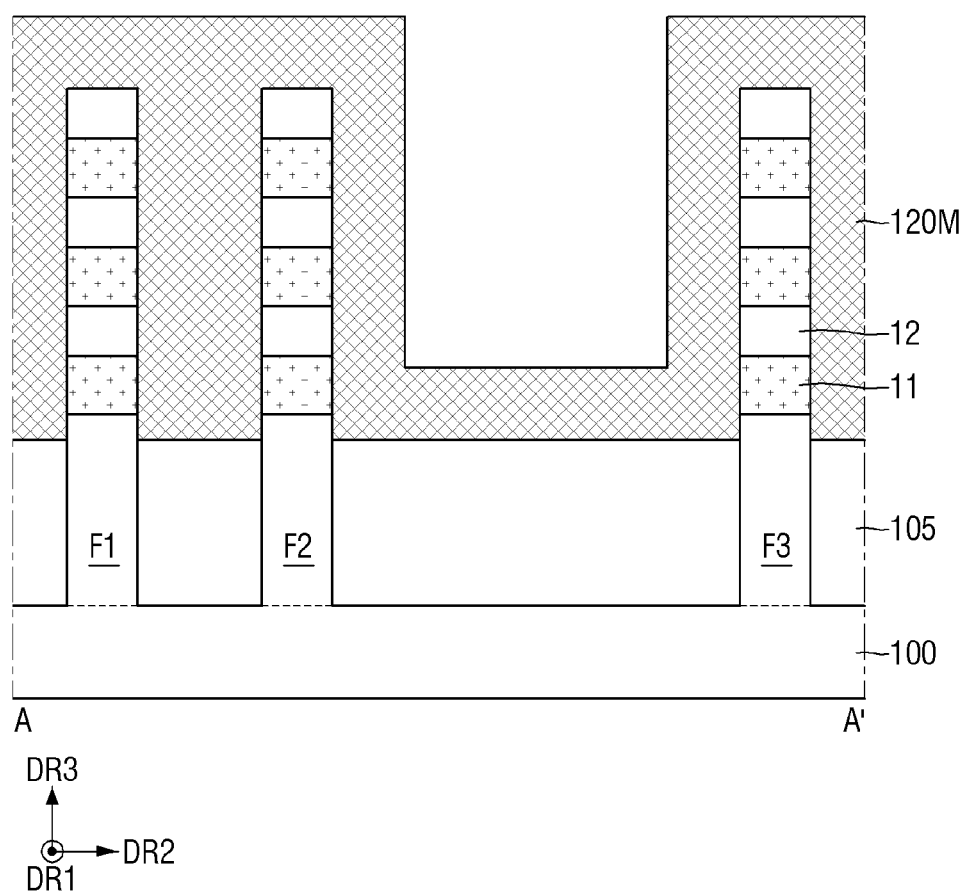

Referring to FIG. 8, an insulating material layer 120M may be formed on the upper surface of the exposed field insulating layer 105, the side walls of each of the first to third active patterns F1, F2 and F3 exposed on the field insulating layer 105, and the side walls of the first semiconductor layer 11 and the side walls of the second semiconductor layer 12. For example, the insulating material layer 120M may be formed conformally.

The insulating material layer 120M may include, for example, one or more materials, such as silicon nitride (SiN), silicon oxynitride (SiON), silicon carbonitride (SiCN), silicon oxycarbonitride (SiOCN), silicon carbide (SiC), silicon oxycarbide (SiOC), or a combination thereof. In some other embodiments, the insulating material layer 120M may include one or more high dielectric constant materials having a higher dielectric constant than silicon oxide ($SiO_2$).

Figure 9:
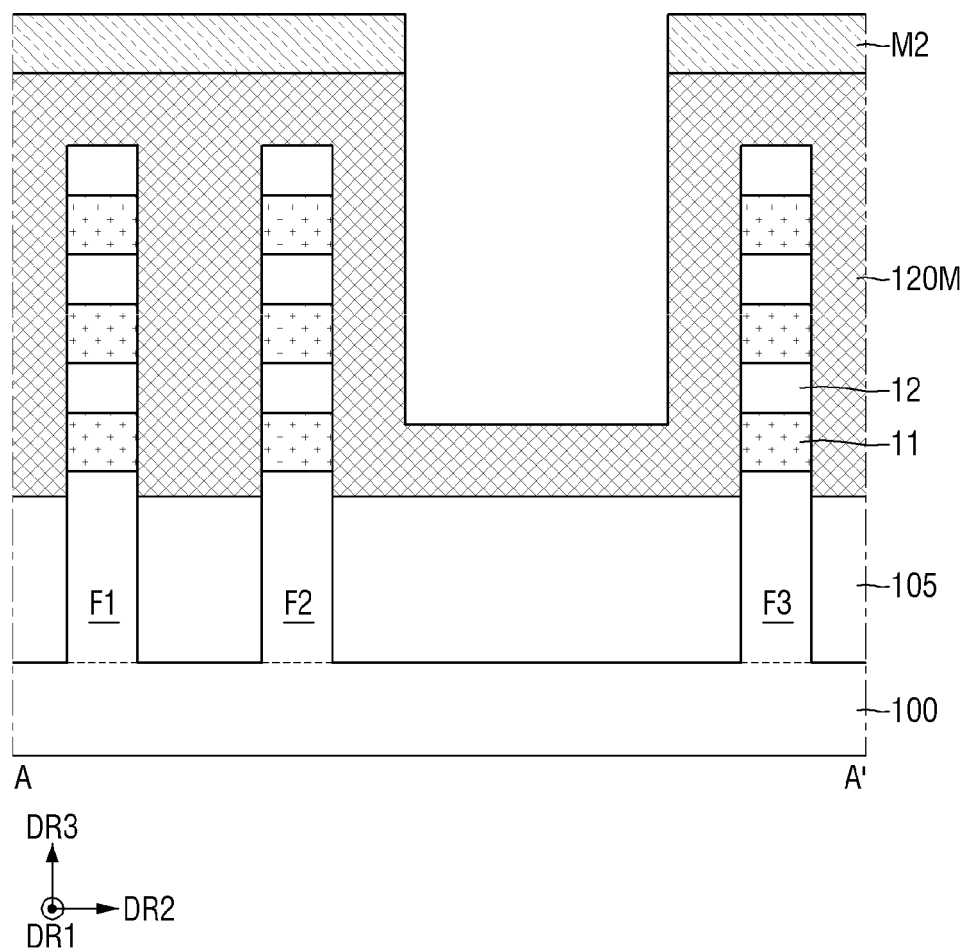

Referring to FIG. 9, a second mask pattern M2 may be formed on the top surface of the insulating material layer 120M. The second mask pattern M2 may include, for example, silicon nitride (SiN). The second mask pattern M2 may be formed, for example, by a PVD process.

The second mask pattern M2 may overlap each of the second semiconductor layer 12 formed on the first active pattern F1, the second semiconductor layer 12 formed on the second active pattern F2, and the second semiconductor layers 12 formed on the third active pattern F3 in the vertical direction DR3.

The insulating material layer 120M may be formed on the insulating material layer 120M formed between the second semiconductor layer 12 formed on the first active pattern F1 and the second semiconductor layer 12 formed on the second active pattern F2. However, the insulating material layer 120M may expose at least a part of the insulating material layer 120M formed between the second semiconductor layer 12 formed on the second active pattern F2 and the second semiconductor layer 12 formed on the third active pattern F3.

Figure 10:
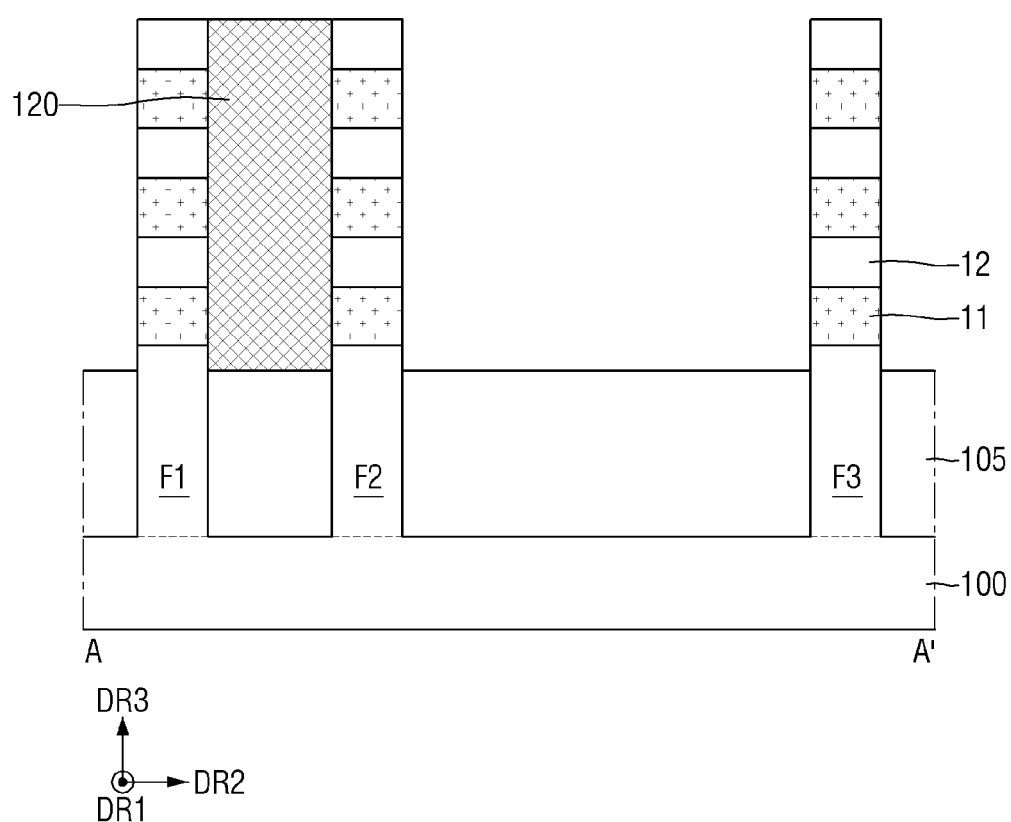

Referring to FIG. 10, a part of the insulating material layer 120M may be removed through the etching process. For example, the remaining insulating material layer 120M except the insulating material layer 120M formed between the second semiconductor layer 12 formed on the first active pattern F1 and the second semiconductor layer 12 formed on the second active pattern F2 may be removed. The dam 120 may be formed between the second semiconductor layer 12 formed on the first active pattern F1 and the second semiconductor layer 12 formed on the second active pattern F2 through such an etching process.

In some other embodiments, the dam 120 may also be formed by etching the insulating material layer 120M through an etch-back process. In some other embodiments, the dam 120 may also be formed by forming a protective layer between the second semiconductor layer 12 and the second semiconductor layer 12 formed on the second active pattern F2, performing the flattening process to expose the second semiconductor layer 12, and then removing the protective layer.

Figure 11:
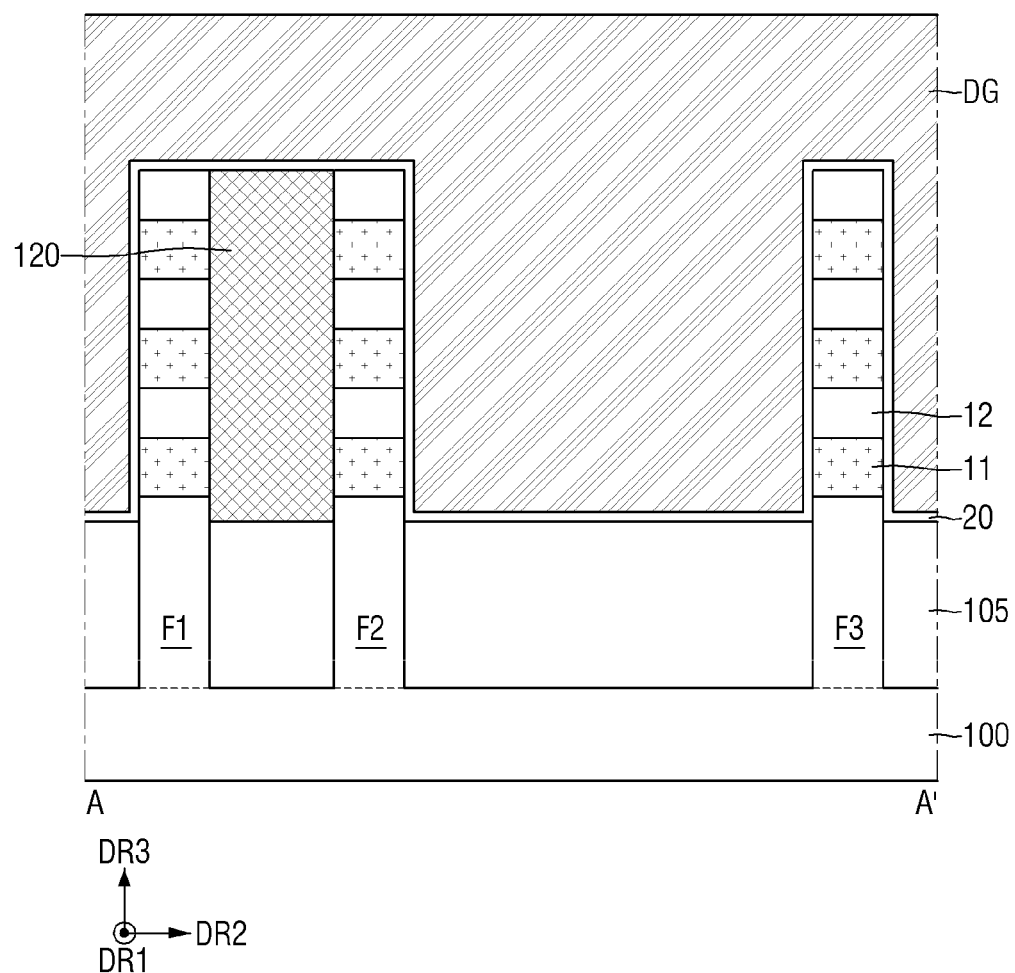

Referring to FIG. 11, the liner layer 20 may be formed on the upper surface of the exposed field insulating layer 105, the side walls of each of the exposed first to third active patterns F1, F2 and F3, the exposed first semiconductor layer 11, the exposed second semiconductor layer 12, and the exposed dam 120. For example, the liner layer 20 may be formed conformally. The liner layer 20 may include an insulating material, for example, silicon oxide ($SiO_2$).

A dummy gate DG may then be formed on the liner layer 20. The dummy gate DG may include, for example, polysilicon. The dummy gate DG may be formed through a patterning process after the dummy gate material layer including polysilicon is formed. Subsequently, a first interlayer insulating layer (140 of FIG. 4) may be formed to at least partially cover the side wall of the dummy gate DG.

Figure 12:
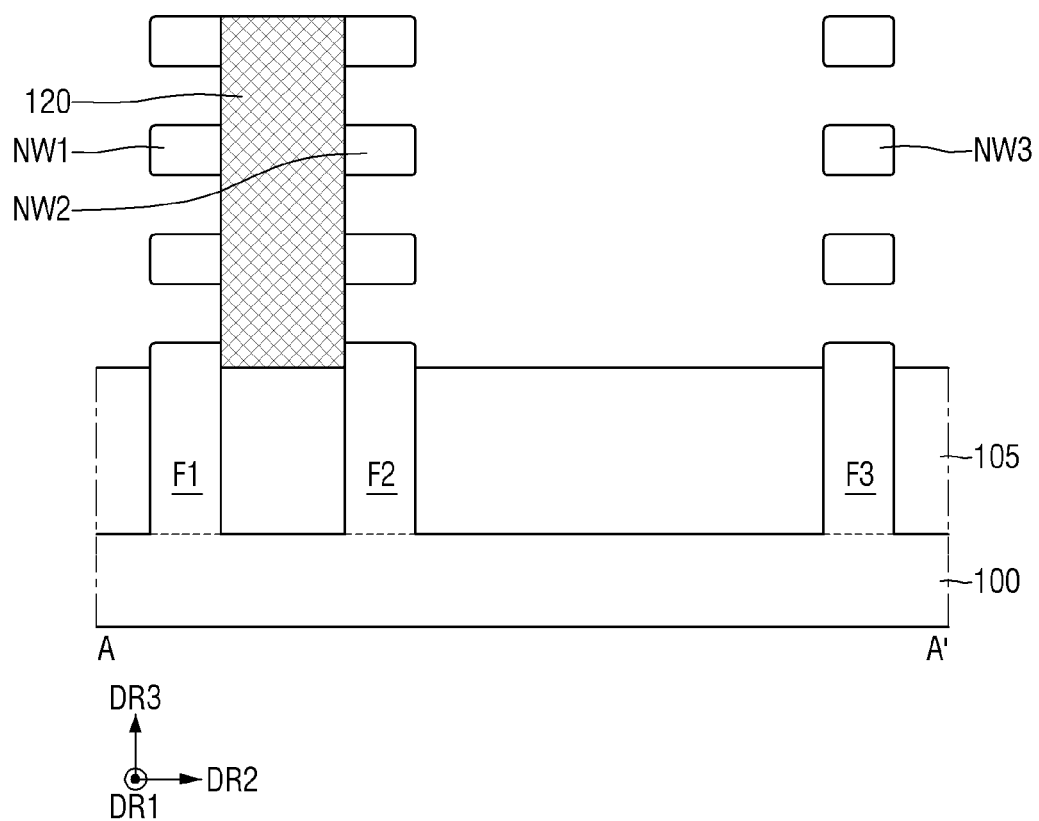

Referring to FIG. 12, the dummy gate DG, the liner layer 20, and the first semiconductor layer 11 may be removed. The second semiconductor layer 12 that has not been removed may be defined as a first to third plurality of nanosheets NW1, NW2 and NW3.

Figure 13:
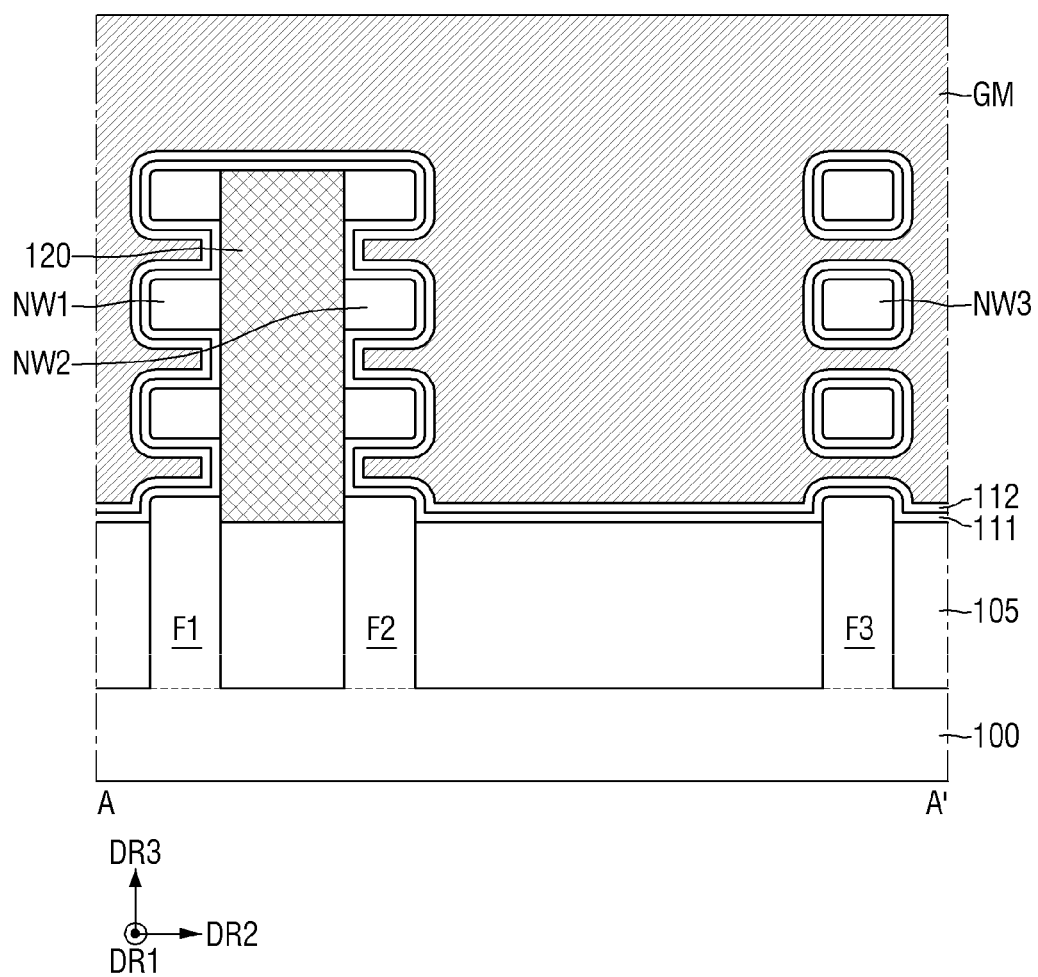

Referring to FIG. 13, a gate insulating layer 111 may be formed on the upper surface of the exposed field insulating layer 105, the side walls of each of the exposed first to third active patterns F1, F2 and F3, the side walls and the upper surface of the exposed dam 120, and the first to third plurality of nanosheets NW1, NW2 and NW3.

Subsequently, the first work function layer 112 may be formed on the gate insulating layer 111. Subsequently, a gate material layer GM may be formed to at least partially fill the portion from which the dummy gate (DG of FIG. 11) is removed.

Figure 14:
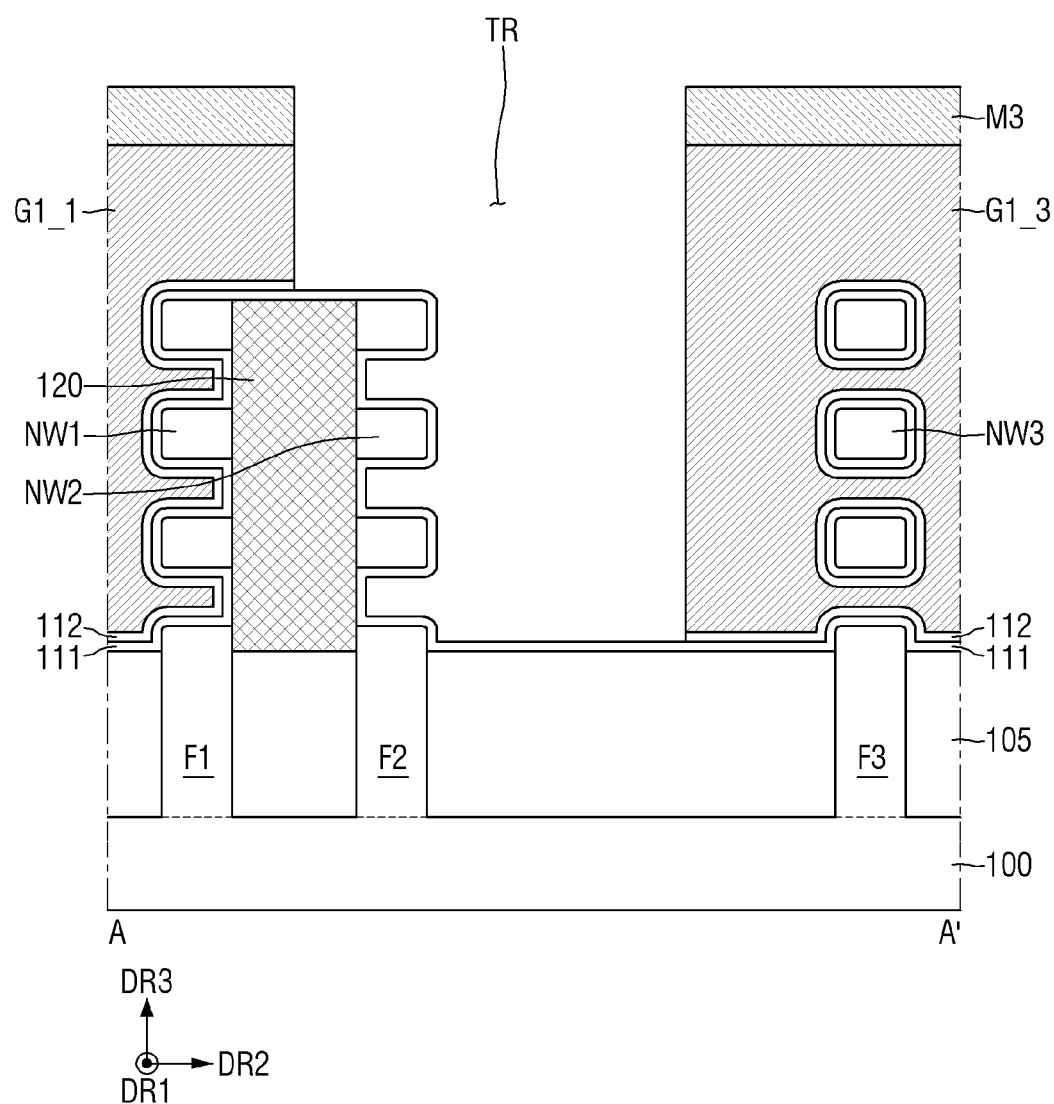

Referring to FIG. 14, a third mask pattern M3 may be formed on the gate material layer (GM of FIG. 13). The third mask pattern M3 may overlap each of the first plurality of nanosheets NW1 and the third plurality of nanosheets NW3 in the vertical direction DR3. The gate material layer (GM of FIG. 13) formed on the second plurality of nanosheets NW2 may be exposed.

Subsequently, the gate material layer (GM of FIG. 13) and the first work function layer 112 may be etched using the third mask pattern M3 as a mask to form a trench TR. The gate insulating layer 111 may be exposed by the trench TR.

For example, after the etching process, the gate material layer remaining on the first plurality of nanosheets NW1 may be defined as the first portion G1_1 of the first gate electrode G1, and the gate material layer remaining on the third plurality of nanosheets NW3 may be defined as the third portion G1_3 of the first gate electrode G1.

Figure 15:
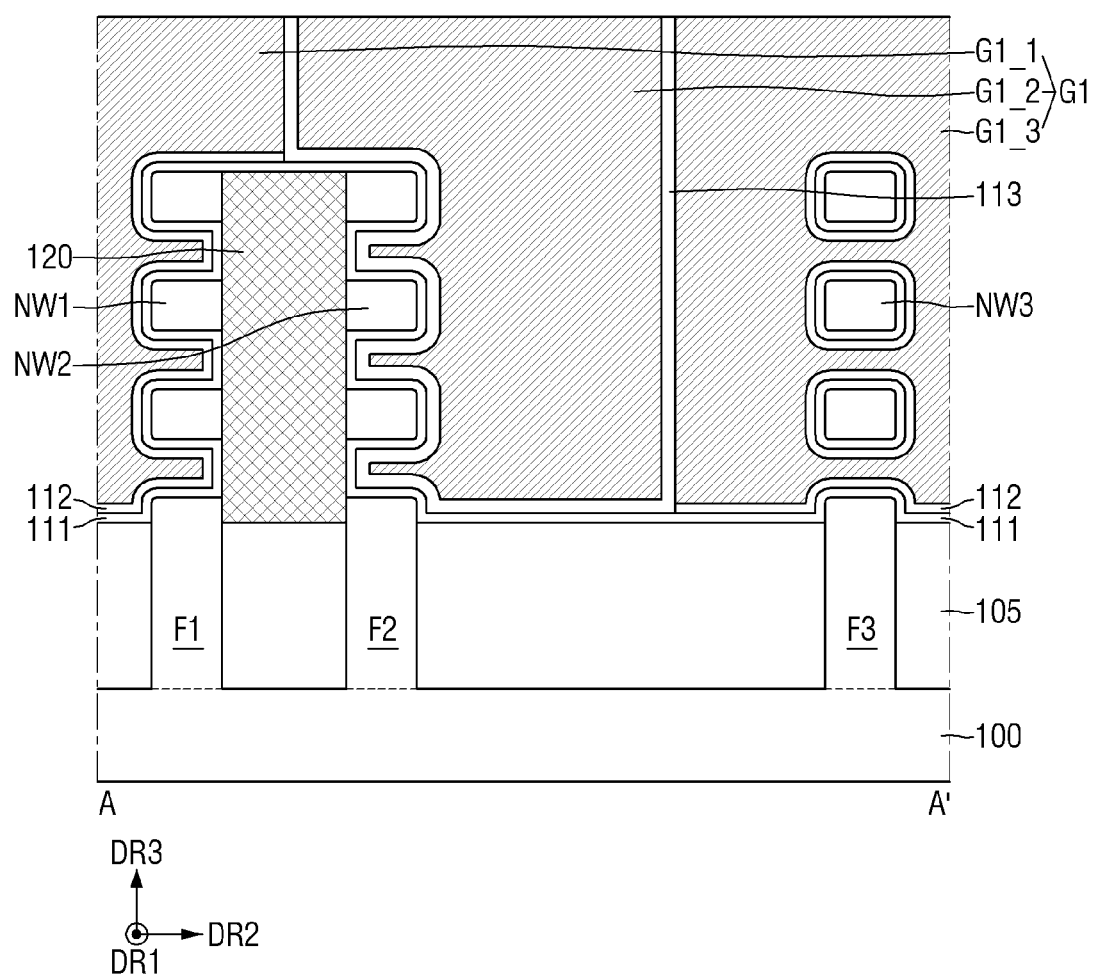

Referring to FIG. 15, a second work function layer 113 may be formed on the gate insulating layer 111 exposed by the trench (TR of FIG. 14). The second work function layer 113 may also be formed on the side wall of the first portion G1_1 of the first gate electrode G1 exposed by the trench (TR of FIG. 14) and the side wall of the third portion G1_3 of the first gate electrode G1. Subsequently, the second portion G1_2 of the first gate electrode G1 may be formed to at least partially fill the trench (TR of FIG. 14) on the second work function layer 113.

Referring to FIG. 2, a capping pattern 115 may be formed on the first gate electrode G1. Subsequently, a gate contact 150 that penetrates the capping pattern 115 in the vertical direction DR3 and is connected to the first gate electrode G1 may be formed.

Subsequently, the etching stop layer 170 and the second interlayer insulating layer 180 may be sequentially formed on the capping pattern 115 and the first interlayer insulating layer (140 of FIG. 4). Subsequently, the first via 191 that penetrates the second interlayer insulating layer 180 and the etching stop layer 170 in the vertical direction DR3 and is connected to the gate contact 150 may be formed. The semiconductor device shown in FIG. 2 may be fabricated through such a fabricating process according to some embodiments of the inventive concept.

Hereinafter, a semiconductor device according to some other embodiments of the inventive concept will be described referring to FIGS. 16 and 17. Differences from the semiconductor device shown in FIGS. 1 to 4 will be the focus of the description.

Figure 16:
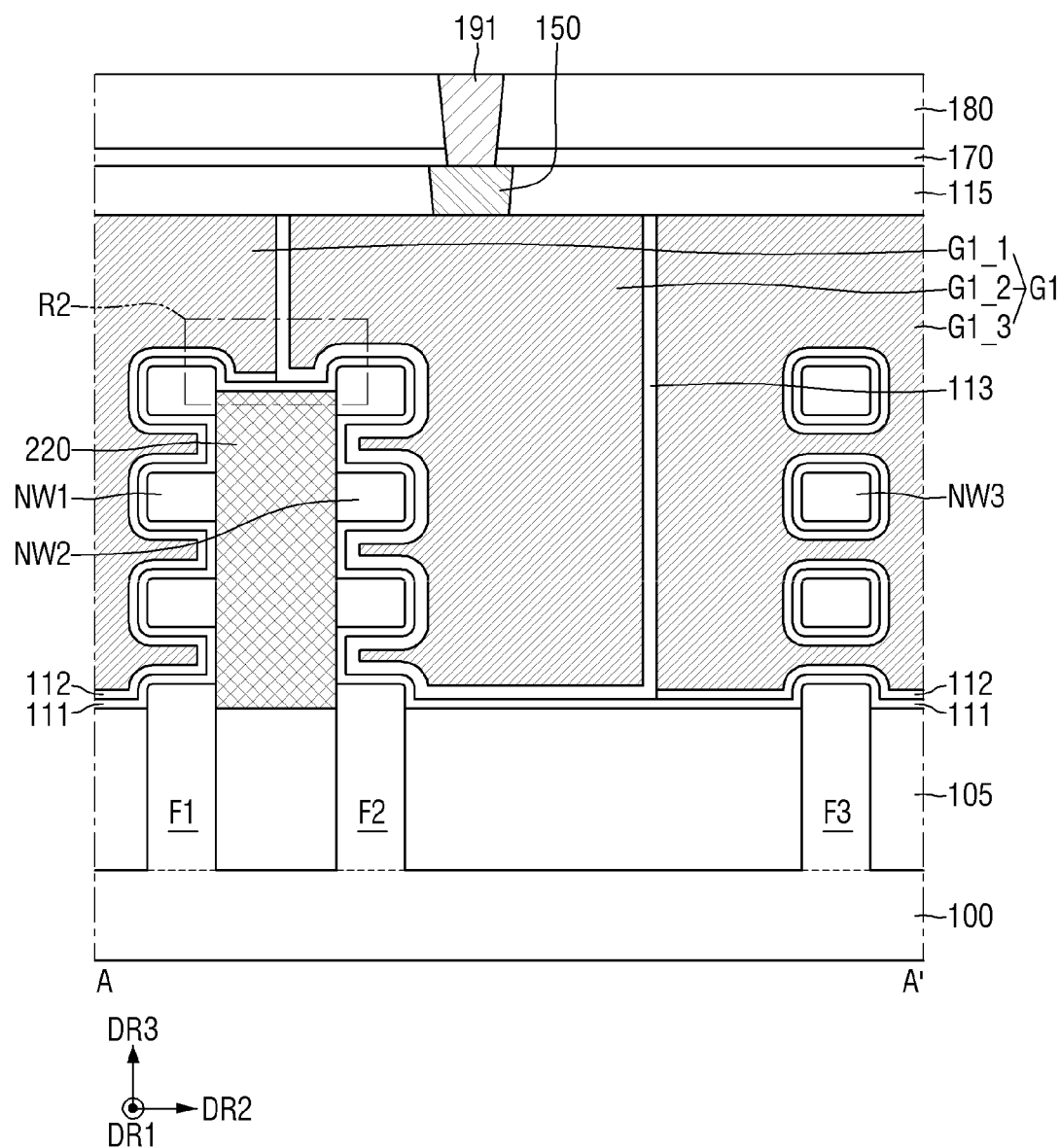
FIG. 16 is a cross-sectional view that illustrates a semiconductor device according to some other embodiments of the inventive concept.

FIG. 16 is a cross-sectional view that illustrates a semiconductor device according to some other embodiments of the inventive concept. FIG. 17 is an enlarged view of a region R2 of FIG. 16.

Figure 17:
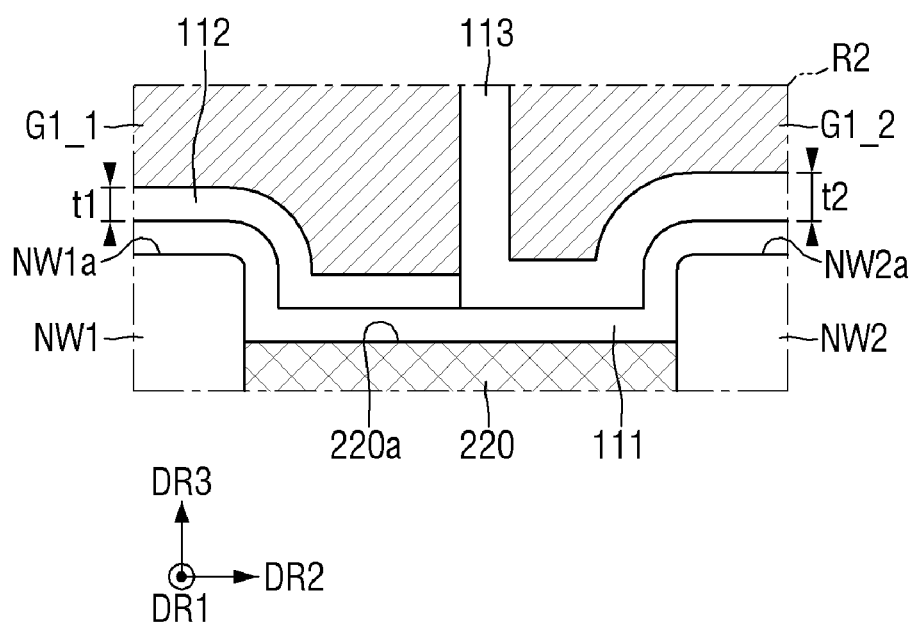
FIG. 17 is an enlarged view of a region R2 of FIG. 16.

Referring to FIGS. 16 and 17, in the semiconductor device according to some other embodiments of the inventive concept, an upper surface 220a of a dam 220 may be formed to be lower than each of an upper surface NW1a of an uppermost nanosheet among the first plurality of nanosheets NW1 and an upper surface NW2a of an uppermost nanosheet among the second plurality of nanosheets NW2 where the substrate 100 provides a base reference layer. The upper surface 220a of the dam 220 may be formed to be higher than each of a lower surface of the uppermost nanosheet among the first plurality of nanosheets NW1 and a lower surface of the uppermost nanosheet among the second plurality of nanosheets NW2 where the substrate 100 provides a base reference layer.

Hereinafter, a semiconductor device according to some other embodiments of the inventive concept will be described referring to FIGS. 18 and 19. Differences from the semiconductor device shown in FIGS. 1 to 4 will be the focus of the description.

Figure 18:
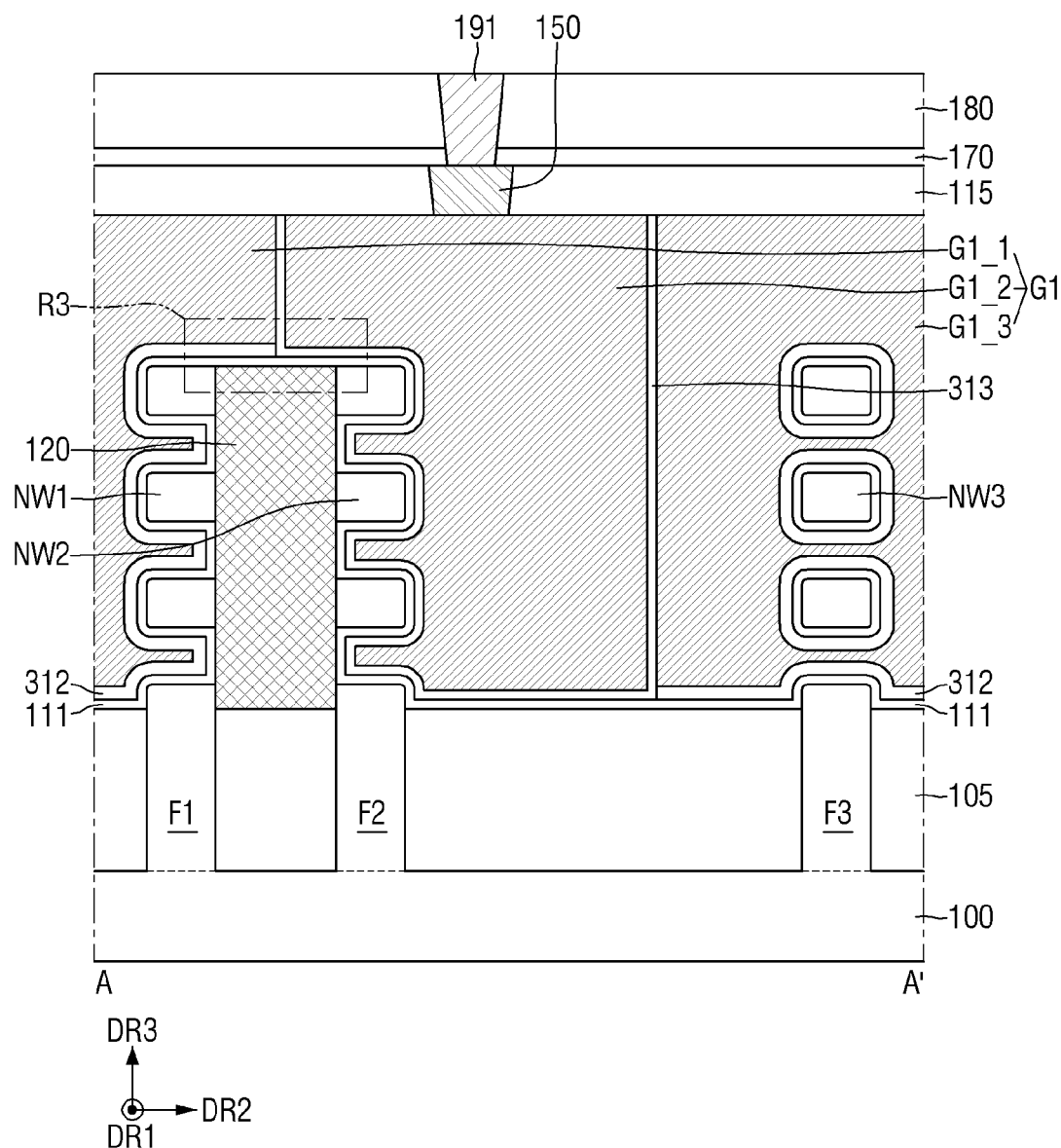
FIG. 18 is a cross-sectional view that illustrates a semiconductor device according to some other embodiments of the inventive concept.

FIG. 18 is a cross-sectional view that illustrates a semiconductor device according to some other embodiments of the inventive concept. FIG. 19 is an enlarged view of a region R3 of FIG. 18.

Figure 19:
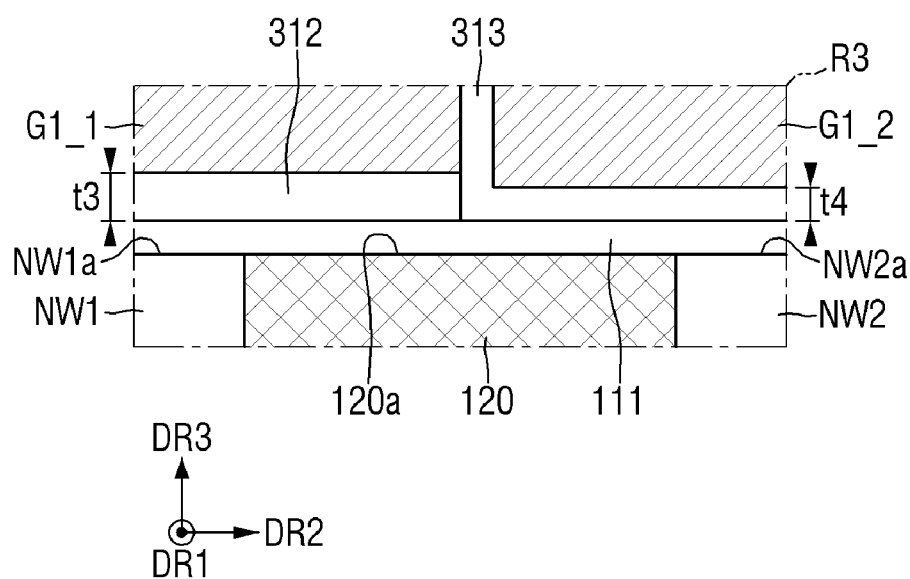
FIG. 19 is an enlarged view of a region R3 of FIG. 18.

Referring to FIGS. 18 and 19, in the semiconductor device according to some other embodiment of the inventive concept, a fourth thickness t4 of the second work function layer 313 may be smaller than a third thickness t3 of the first work function layer 312.

The first work function layer 312 and the second work function layer 313 may include different materials from each other. Although the first work function layer 312 may include, for example, titanium oxide, embodiments of the inventive concept are not limited thereto. The second work function layer 313 may include, for example, one or more materials, such as lanthanum oxide, titanium oxide, aluminum oxide, zirconium oxide, and/or hafnium oxide. However, embodiments of the inventive concept are not limited thereto.

Hereinafter, a semiconductor device according to some other embodiments of the inventive concept will be described referring to FIGS. 20 and 21. Differences from the semiconductor device shown in FIGS. 1 to 4 will be the focus of the description.

Figure 20:
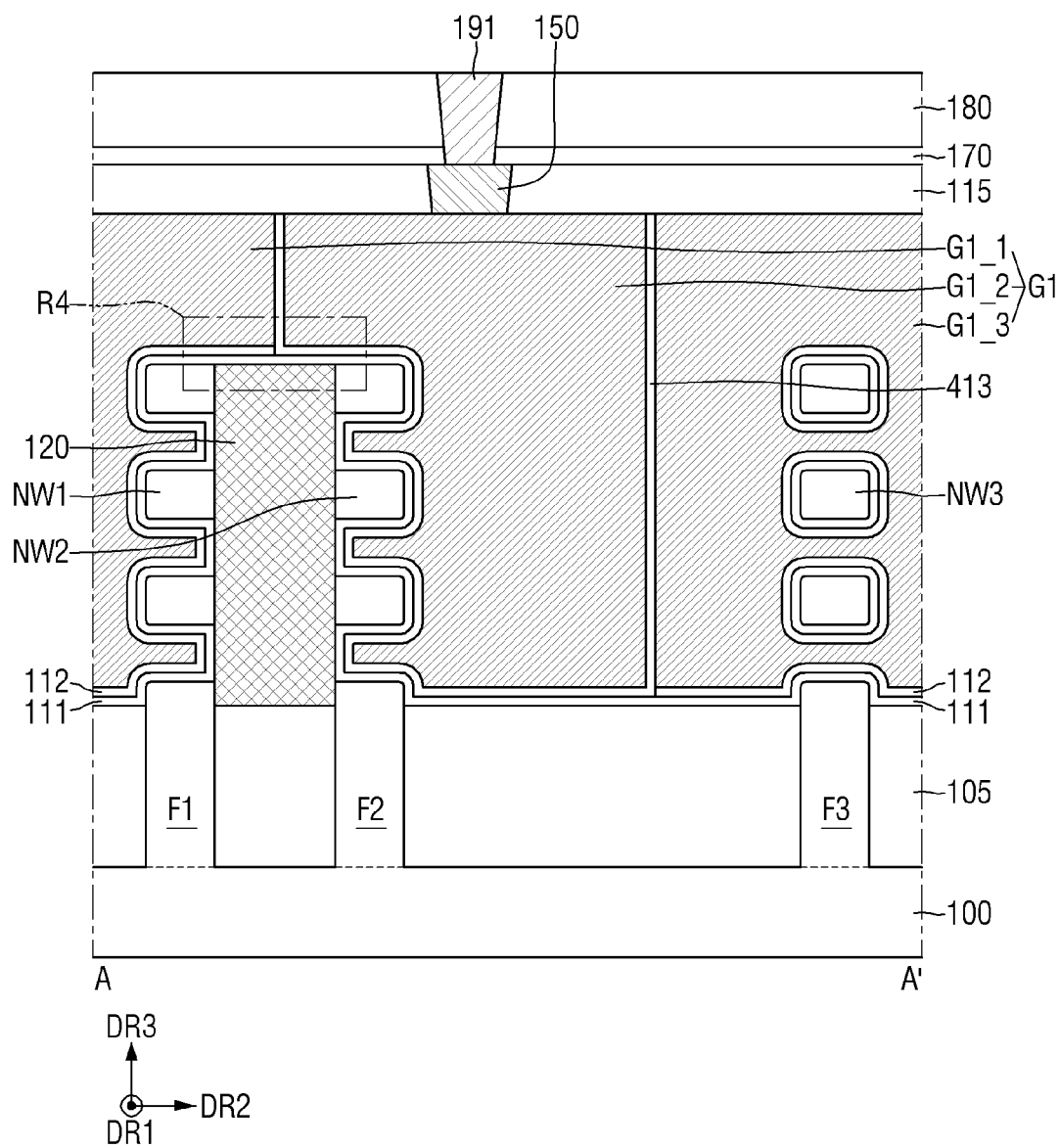
FIG. 20 is a cross-sectional view that illustrates a semiconductor device according to some other embodiments of the inventive concept.

FIG. 20 is a cross-sectional view that illustrates a semiconductor device according to some other embodiments of the inventive concept. FIG. 21 is an enlarged view of a region R4 of FIG. 20.

Figure 21:
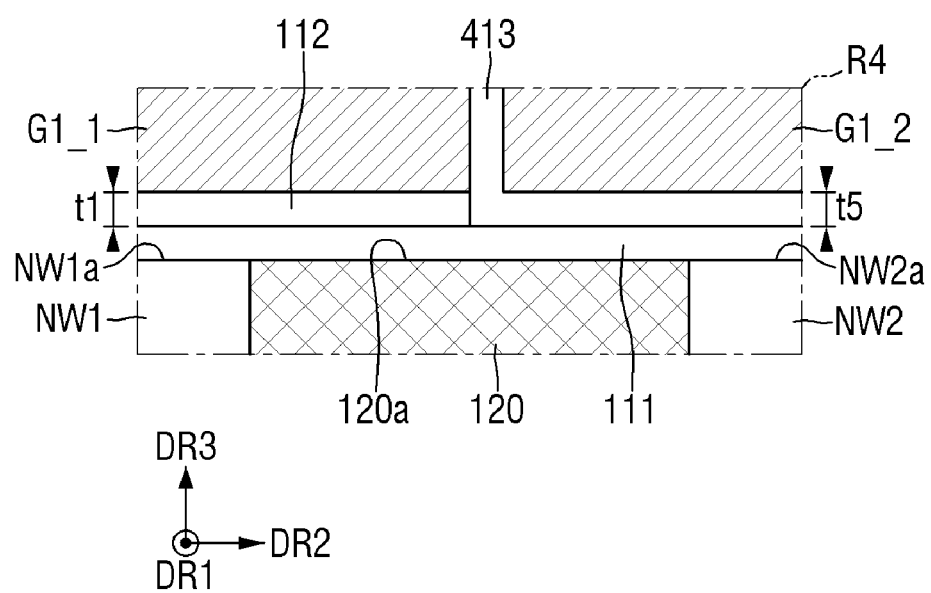
FIG. 21 is an enlarged view of a region R4 of FIG. 20.

Referring to FIGS. 20 and 21, in the semiconductor device according to some other embodiment of the inventive concept, a fifth thickness t5 of a second work function layer 413 may be the same as the first thickness t1 of the first work function layer 112.

The first work function layer 112 and the second work function layer 413 may include different materials from each other. The first work function layer 112 may include, for example, one or more materials, such as lanthanum oxide, titanium oxide, aluminum oxide, zirconium oxide, and/or hafnium oxide. However, the present disclosure is not limited thereto. Although the second work function layer 413 may include, for example, titanium oxide, embodiments of the inventive concept are not limited thereto.

Hereinafter, a semiconductor device according to some other embodiments of the inventive concept will be described referring to FIGS. 22 to 24. Differences from the semiconductor device shown in FIGS. 1 to 4 will be the focus of the description.

Figure 22:
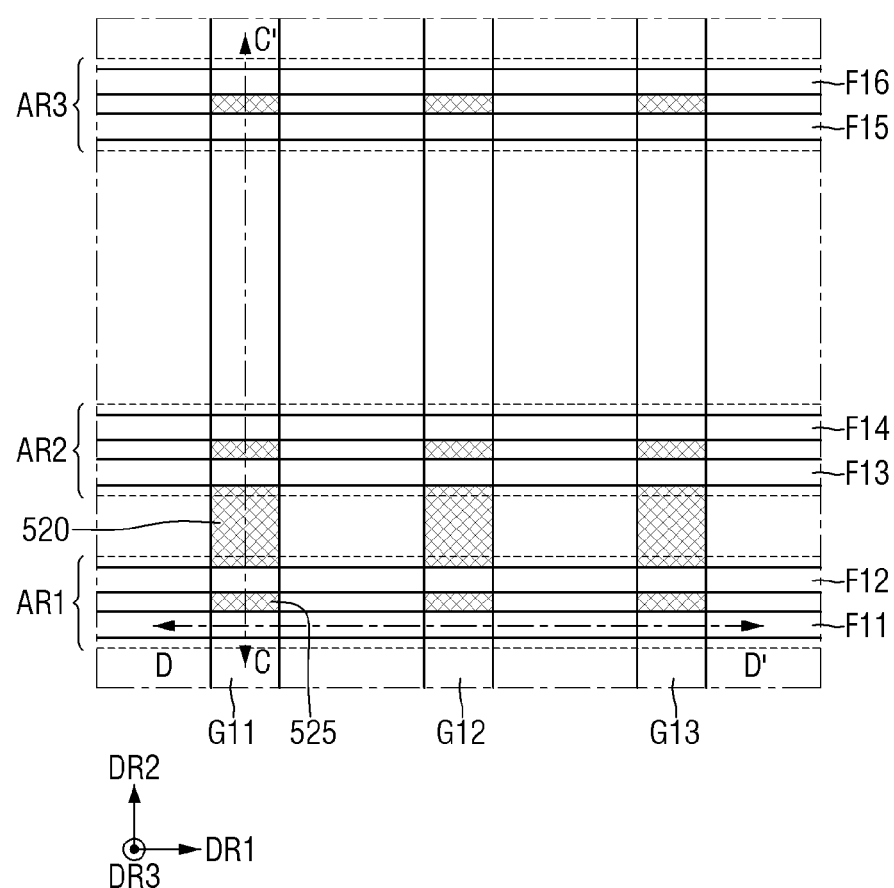
FIG. 22 is a schematic layout diagram that illustrates a semiconductor device according to some other embodiments of the inventive concept.

FIG. 22 is a schematic layout diagram that illustrates a semiconductor device according to some other embodiments of the inventive concept. FIG. 23 is a cross-sectional view taken along a line C-C' of FIG. 22. FIG. 24 is a cross-sectional view taken along a line D-D' of FIG. 22.

Figure 23:
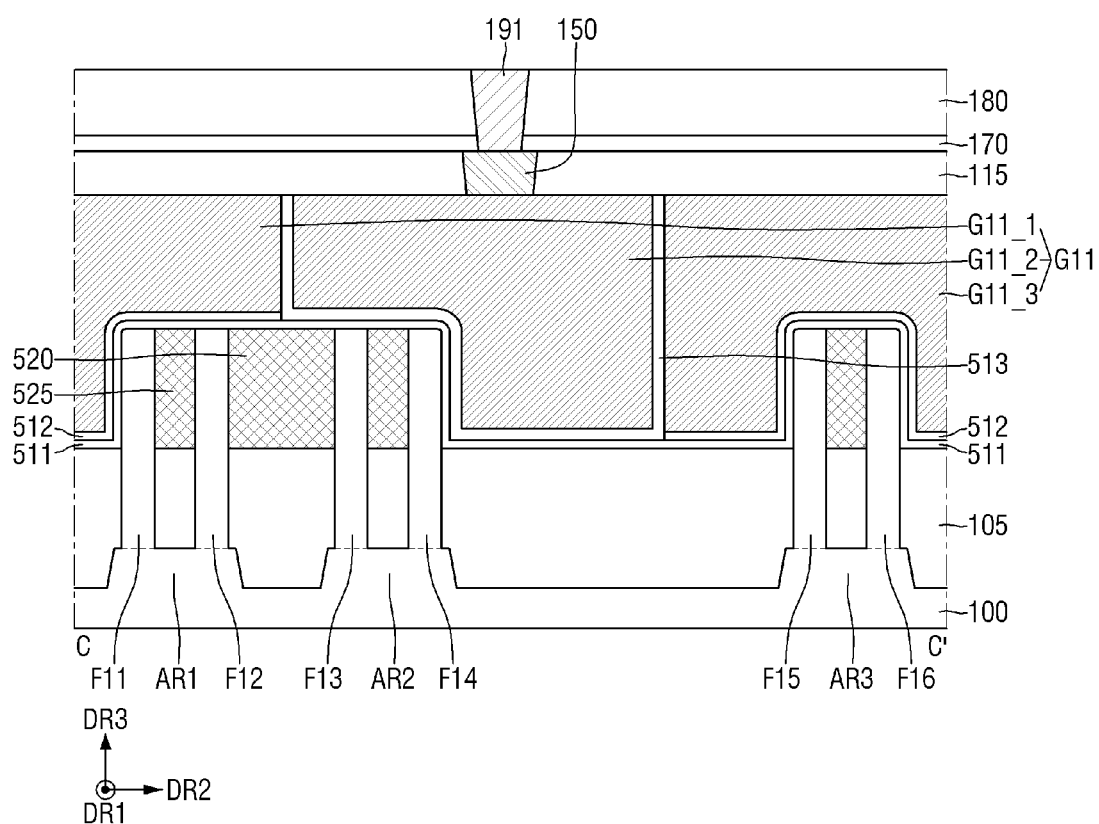
FIG. 23 is a cross-sectional view taken along a line C-C' of FIG. 22.
Figure 24:
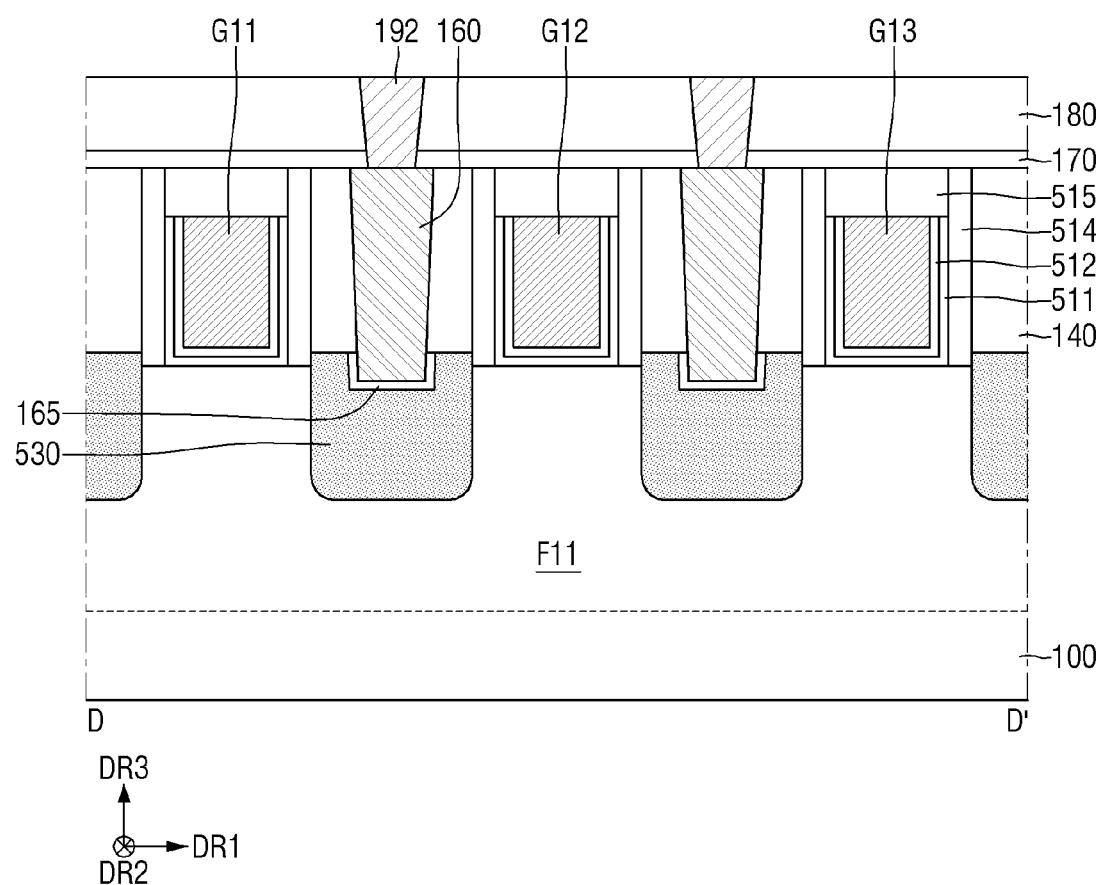
FIG. 24 is a cross-sectional view taken along a line D-D' of FIG. 22.

Referring to FIGS. 22 to 24, the semiconductor device according to some other embodiment of the present disclosure may include a fin-type transistor FinFET. For example, the semiconductor device according to some other embodiments of the present disclosure includes a substrate 100, first to third active regions AR1, AR2 and AR3, first to sixth active patterns F11 to F16, a field insulating layer 105, first to third gate electrodes G11, G12 and G13, a gate insulating layer 511, a first work function layer 512, a second work function layer 513, a gate spacer 514, a capping pattern 515, a first dam 520, a second dam 525, a source/drain region 530, a first interlayer insulating layer 140, a gate contact 150, a source/drain contact 160, a silicide layer 165, an etching stop layer 170, a second interlayer insulating layer 180, a first via 191, and a second via 192.

Each of the first to third active regions AR1, AR2 and AR3 may protrude from the substrate 100 in the vertical direction DR3. The field insulating layer 105 may be disposed between each of the first to third active regions AR1, AR2 and AR3.

A first active region AR1 may extend in the first horizontal direction DR1. A second active region AR2 may be spaced apart from the first active region AR1 in the second horizontal direction DR2. The second active region AR2 may extend in the first horizontal direction DR1. A third active region AR3 may be spaced apart from the second active region AR2 in the second horizontal direction DR2. The third active region AR3 may extend in the first horizontal direction DR1.

Each of the first active pattern F11 and the second active pattern F12 may extend in the first horizontal direction DR1 on the first active region AR1. The second active pattern F12 may be spaced apart from the first active pattern F11 in the second horizontal direction DR2. Each of the third active pattern F13 and the fourth active pattern F14 may extend in the first horizontal direction DR1 on the second active region AR2. The fourth active pattern F14 may be spaced apart from the third active pattern F13 in the second horizontal direction DR2. Each of the fifth active pattern F15 and the sixth active pattern F16 may extend in the first horizontal direction DR1 on the third active region AR3. The sixth active pattern F16 may be spaced apart from the fifth active pattern F15 in the second horizontal direction DR2.

Each of the first to third gate electrodes G11, G12 and G13 may extend in the second horizontal direction DR2 on the field insulating layer 105 and the first to sixth active patterns F11 to F16. Each of the first to third gate electrodes G11, G12 and G13 may intersect each of the first to sixth active patterns F11 to F16. Each of the first to third gate electrodes G11, G12 and G13 may be sequentially spaced apart from each other in the first horizontal direction DR1.

For example, the first gate electrode G11 may include a first portion G11_1, a second portion G11_2, and a third portion G11_3. The first portion G11_1 of the first gate electrode G11 may be disposed on the first and second active patterns F11 and F12. At least a part of the first portion G11_1 of the first gate electrode G11 may be disposed on the upper surface of the first dam 520.

The second portion G11_2 of the first gate electrode G11 may be disposed on the third and fourth active patterns F13 and F14. At least a part of the second portion G11_2 of the first gate electrode G11 may be disposed on the upper surface of the first dam 520. The third portion G11_3 of the first gate electrode G11 may be disposed on the fifth and sixth active patterns F15 and F16.

The first dam 520 may be disposed between the second active pattern F12 and the third active pattern F13. The first dam 520 may be in physical contact with each of the second active pattern F12 and the third active pattern F13. Further, the first dam 520 may be in physical contact with the upper surface of the field insulating layer 105. The upper surface of the first dam 520 may be formed on the same plane as each of the upper surface of the second active pattern F12 and the upper surface of the third active pattern F13.

The second dam 525 may be disposed between the first active pattern F11 and the second active pattern F12, between the third active pattern F13 and the fourth active pattern F14, and between the fifth active pattern F15 and the sixth active pattern F16, respectively. The second dam 525 disposed between the first active pattern F11 and the second active pattern F12 may be in physical contact with each of the first active pattern F11 and the second active pattern F12. The second dam 525 disposed between the third active pattern F13 and the fourth active pattern F14 may be in physical contact with each of the third active pattern F13 and the fourth active pattern F14. The second dam 525 disposed between the fifth active pattern F15 and the sixth active pattern F16 may be in physical contact with each of the fifth active pattern F15 and the sixth active pattern F16.

The upper surface of the second dam 525 may be formed on the same plane as the upper surfaces of each of the first to sixth active patterns F11 to F16. Further, the upper surface of the second dam 525 may be disposed on the same plane as the upper surface of the first dam 520. A width of the first dam 520 in the second horizontal direction DR2 may be greater than a width of the second dam 525 in the second horizontal direction DR2.

The gate insulating layer 511 may be disposed between each of the first to third gate electrodes G11, G12 and G13 and the gate spacer 514. The gate insulating layer 511 may be disposed between each of the first to third gate electrodes G11, G12 and G13 and each of the first to sixth active patterns F11 to F16. The gate insulating layer 511 may be disposed between each of the first to third gate electrodes G11, G12 and G13 and the field insulating layer 105.

Further, the gate insulating layer 511 may be disposed between each of the first to third gate electrodes G11, G12 and G13 and the first dam 520. The gate insulating layer 511 may be disposed between each of the first to third gate electrodes G11, G12 and G13 and the second dam 525.

For example, the first work function layer 512 may be disposed between the gate insulating layer 511 and the first portion G11_1 of the first gate electrode G11. The first work function layer 512 may be disposed between the gate insulating layer 511 and the third portion G11_3 of the first gate electrode G11. Further, the first work function layer 512 may be disposed between the first portion G11_1 of the first gate electrode G11 and the first dam 520. The first work function layer 512 may be disposed between each of the first and third portions G11_1 and G11_3 of the first gate electrode G11 and the second dam 525.

For example, the second work function layer 513 may be disposed between the gate insulating layer 511 and the second portion G11_2 of the first gate electrode G11. The second work function layer 513 may be disposed to extend along the interface between the first portion G11_1 of the first gate electrode G11 and the second portion G11_2 of the first gate electrode G11. The second work function layer 513 may be disposed to extend along the interface between the second portion G11_2 of the first gate electrode G11 and the third portion G11_3 of the first gate electrode G11. Further, the second work function layer 513 may be disposed between the second portion G11_2 of the first gate electrode G11 and the first dam 520. The second work function layer 513 may be disposed between the second portion G11_2 of the first gate electrode G11 and the second dam 525.

The capping pattern 515 may be disposed on each of the first to third gate electrodes G11, G12 and G13. The source/ drain region 530 may be disposed on at least one side of each of the first to third gate electrodes G11, G12 and G13 on each of the first to sixth active patterns F11 to F16.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
a substrate;
a first active pattern, which extends in a first direction on the substrate;
a second active pattern, which extends in the first direction on the substrate and is spaced apart from the first active pattern by a first pitch in a second direction different from the first direction;
a third active pattern, which extends in the first direction on the substrate and is spaced apart from the second active pattern by a second pitch greater than the first pitch in the second direction;
a field insulating layer, which borders side walls of each of the first to third active patterns;
a dam, which is between the first active pattern and the second active pattern on the field insulating layer, the dam having an upper surface including a first portion and a second portion;
a gate electrode, which extends in the second direction, and has a first portion on the first active pattern, a second portion on the second active pattern, and a third portion on the third active pattern;
a first work function layer disposed between the first portion of the gate electrode and the dam and covering the first portion different from the second portion of the upper surface of the dam; and
a second work function layer disposed between the second portion of the gate electrode and the dam and covering the second portion different from the first portion of the upper surface the dam.

2. The semiconductor device of claim 1, wherein a part of the second work function layer extends along an interface between the first portion of the gate electrode and the second portion of the gate electrode.

3. The semiconductor device of claim 1, wherein a top surface of the second work function layer is formed on a same plane as an upper surface of the gate electrode.

4. The semiconductor device of claim 1, wherein a first thickness of the first work function layer is different from a second thickness of the second work function layer.

5. The semiconductor device of claim 1, further comprising:
a first plurality of nanosheets, which are spaced apart from each other in a third direction on the first active pattern, and are bordered by the first portion of the gate electrode; and
a second plurality of nanosheets, which are spaced apart from each other in the third direction on the second active pattern, and are bordered by the second portion of the gate electrode,
wherein the third direction is perpendicular to a plane defined by the first direction and the second direction.

6. The semiconductor device of claim 5, wherein the dam is in physical contact with each of the first plurality of nanosheets and the second plurality of nanosheets.

7. The semiconductor device of claim 5, wherein the upper surface of the dam is on a same plane as an upper surface of an uppermost nanosheet among the first plurality of nanosheets.

8. The semiconductor device of claim 5, wherein the upper surface of the dam is lower than an upper surface of an uppermost nanosheet among the first plurality of nanosheets with respect to the substrate.

9. The semiconductor device of claim 1, wherein the upper surface of the dam is on a same plane as an upper surface of the first active pattern.

10. The semiconductor device of claim 9, further comprising a fourth active pattern extending in the first direction between the first active pattern and the second active pattern,
wherein the dam includes a first dam between the first active pattern and the fourth active pattern, and a second dam between the fourth active pattern and the second active pattern, and
a width of the first dam in the second direction is greater than a width of the second dam in the second direction.

11. The semiconductor device of claim 1, wherein the first work function layer and the second work function layer include different materials from each other.

12. The semiconductor device of claim 1, further comprising:
a gate insulating layer between the dam and the first work function layer, and between the dam and the second work function layer.

13. The semiconductor device of claim 1, wherein the dam is in physical contact with at least a part of side walls of the first active pattern.

14. A semiconductor device comprising:
a substrate;
a first active pattern, which extends in a first direction on the substrate;
a second active pattern, which extends in the first direction on the substrate and is spaced apart from the first active pattern by a first pitch in a second direction different from the first direction;
a third active pattern, which extends in the first direction on the substrate and is spaced apart from the second active pattern by a second pitch greater than the first pitch in the second direction;
a first plurality of nanosheets spaced apart from each other in a third direction on the first active pattern, the third direction being perpendicular to a plane defined by the first direction and the second direction;
a second plurality of nanosheets spaced apart from each other in the third direction on the second active pattern;
a third plurality of nanosheets spaced apart from each other in the third direction on the third active pattern;
a field insulating layer, which borders side walls of each of the first to third active patterns;
a dam, which is on the field insulating layer, between the first plurality of nanosheets and the second plurality of nanosheets; and
a gate electrode, which extends in the second direction, and includes a first portion, which borders the first plurality of nanosheets, a second portion, which borders the second plurality of nanosheets, and a third portion, which borders the third plurality of nanosheets,
wherein an upper surface of the dam is on a same plane as an upper surface of an uppermost nanosheet among the first plurality of nanosheets, or the upper surface of the dam is lower than the upper surface of the uppermost nanosheet with respect to the substrate.

15. The semiconductor device of claim 14, wherein the dam is in physical contact with each of the first plurality of nanosheets and the second plurality of nanosheets.

16. The semiconductor device of claim 14, further comprising:
a first work function layer between the first portion of the gate electrode and the dam; and
a second work function layer between the second portion of the gate electrode and the dam,
wherein a part of the second work function layer extends along an interface between the first portion of the gate electrode and the second portion of the gate electrode.

17. The semiconductor device of claim 16, wherein a first thickness of the first work function layer is different from a second thickness of the second work function layer.

18. The semiconductor device of claim 16, wherein another part of the second work function layer extends along the interface between the second portion of the gate electrode and the third portion of the gate electrode.

19. The semiconductor device of claim 14, wherein the dam is in physical contact with an upper surface of the field insulating layer.

20. A semiconductor device comprising:
a substrate;
a first active pattern, which extends in a first direction on the substrate;
a second active pattern, which extends in the first direction on the substrate and is spaced apart from the first active pattern by a first pitch in a second direction different from the first direction;
a third active pattern, which extends in the first direction on the substrate and is spaced apart from the second active pattern by a second pitch greater than the first pitch in the second direction;
a first plurality of nanosheets spaced apart from each other in a third direction on the first active pattern, the third direction being perpendicular to a plane defined by the first direction and the second direction;
a second plurality of nanosheets spaced apart from each other in the third direction on the second active pattern;
a third plurality of nanosheets spaced apart from each other in the third direction on the third active pattern;
a field insulating layer, which borders side walls of each of the first to third active patterns;
a dam, which is on the field insulating layer, between the first plurality of nanosheets and the second plurality of nanosheets, and is in physical contact with each of the first and second plurality of nanosheets;
a gate electrode, which extends in the second direction, and includes a first portion, which borders the first plurality of nanosheets, a second portion, which borders the second plurality of nanosheets, and a third portion, which borders the third plurality of nanosheets;
a first work function layer, which is between the first portion of the gate electrode and the dam, and has a first thickness;
a second work function layer, which is between the second portion of the gate electrode and the dam, and has a second thickness greater than the first thickness; and
a gate insulating layer, which is between the dam and the first work function layer, and between the dam and the second work function layer,
wherein a part of the second work function layer extends along an interface between the first portion of the gate electrode and the second portion of the gate electrode, and another part of the second work function layer extends along an interface between the second portion of the gate electrode and the third portion of the gate electrode, and
an upper surface of the dam is on a same plane as an upper surface of an uppermost nanosheet among the first plurality of nanosheets.

* * * * *